(12) United States Patent
Quijada et al.

(10) Patent No.: US 12,631,804 B1
(45) Date of Patent: May 19, 2026

(54) ALUMINUM MIRRORS PASSIVATED WITH AN AlF₃ OVERCOAT AND METHODS OF MAKING AND USING THE SAME

(71) Applicant: United States of America as represented by the Administrator of NASA, Washington, DC (US)

(72) Inventors: Manuel A. Quijada, Laurel, MD (US); Javier Del Hoyo, Pasadena, CA (US); Luis Rodriguez de Marcos, Washington, DC (US); Edward J. Wollack, Clarksville, MD (US); Vivek H. Dwivedi, Glenn Dale, MD (US)

(73) Assignee: United States of America as represented by the Adminisrator of NASA, Washington, DC (US)

( * ) Notice: Subject to any disclaimer, the term of this patent is extended or adjusted under 35 U.S.C. 154(b) by 289 days.

(21) Appl. No.: 18/372,880

(22) Filed: Sep. 26, 2023

Related U.S. Application Data

(63) Continuation-in-part of application No. 18/093,549, filed on Jan. 5, 2023.

(51) Int. Cl.
 G02B 5/08 (2006.01)
 C23C 14/08 (2006.01)
 G02B 1/14 (2015.01)
(52) U.S. Cl.
 CPC .......... G02B 5/0808 (2013.01); C23C 14/081 (2013.01); G02B 1/14 (2015.01)

(58) Field of Classification Search
 None
 See application file for complete search history.

(56) References Cited

U.S. PATENT DOCUMENTS

| | | | | |
|---|---|---|---|---|
| 2004/0006249 A1* | 1/2004 | Hoshino | ................... | C23C 8/02 |
| | | | | 422/240 |
| 2005/0023131 A1* | 2/2005 | Takaki | ................ | C23C 14/0047 |
| | | | | 204/192.12 |
| 2022/0049345 A1* | 2/2022 | Delgado | ............. | C23C 14/0026 |
| 2024/0035163 A1* | 2/2024 | Lange | .................. | G02B 13/143 |
| 2025/0271783 A1* | 8/2025 | Wiegand | .............. | G02B 5/0891 |

* cited by examiner

*Primary Examiner* — Jyotsna V Dabbi
(74) *Attorney, Agent, or Firm* — Heather Goo; Matthew F. Johnston; Trenton J. Roche

(57) ABSTRACT

A passivated reflective laminate is formed by positioning a substrate in a first reaction chamber; placing the first reaction chamber under vacuum with the substrate therein; depositing an aluminum layer on the substrate while maintaining the vacuum; exposing the aluminum layer to XeF₂ gas to form an AlF₃ layer on the aluminum layer while maintaining the vacuum; and breaking the vacuum to obtain the passivated reflective laminate. The AlF₃ layer is a surface layer on the passivated reflective laminate. The passivated reflective laminate may optionally be positioned in a second reaction chamber, and the second reaction chamber may be placed under vacuum with the passivated reflective laminate therein. In the second reaction chamber, a dielectric layer is deposited on the passivated reflective laminate; and the vacuum is broken to allow removal of the passivated reflective laminate from the second reactor. The dielectric layer on the passivated reflective laminate is a surface layer covering the AlF₃ layer.

19 Claims, 15 Drawing Sheets

Wavelength (nm)

| Sample ID | Roughness RMS (nm) | R @ 122 nm (Fresh) | Storage time → R @ 122 nm (Aged) | Storage environment |
|---|---|---|---|---|
| 09 | 1.56 | 0.926 | 1 week→0.923<br>2 weeks→0.918<br>3 weeks→0.913<br>18 weeks→0.905<br>6 months → 0.908<br>12 weeks → 0.913 | Desiccator 30-33% RH |
| 11 | 1.60 | 0.926 | 13 weeks + 1 week humidity test (50%) →0.914<br>13 weeks+ 1 week humidity test (50%) + 1 week humidity test (60%) →0.910<br>13 weeks+ 1 week humidity test (50%) + 2 weeks humidity test (60%) →0.898 | Humidity chamber 50% + 60% RH, 25°C |

FIG. 12

| Sample ID | Roughness RMS (nm) | R @ 103 nm (Fresh) | R @ 103 nm (Aged) | R @ 122 nm (Fresh) | R @ 122 nm (Aged) | Storage environment |
|---|---|---|---|---|---|---|
| 18A (w/o Ti) | 3.06 (Accidentally sprayed with water) | 0.710 | 6 weeks→ 0.630 (Accidentally sprayed with water) | 0.846 | 6 weeks→ 0.709 (Accidentally sprayed with water) | Desiccator 30-33% RH |
| 18B (with Ti) | 1.02 | 0.713 | 6 weeks→0.723 | 0.857 | 6 weeks→0.829 | Desiccator 30-33% RH |
| | | | 3 months →0.726 | | 3 months →0.825 | Humidity chamber 50% + >100% RH, 25°C |
| | | | 17 weeks + 1 week humidity test (50%) +30' RH> 100%→0.642 | | 17 weeks + 1 week humidity test (50%) +30' (RH> 100%) →0.767 | |
| Standard Al/LiF Baseline | 2.34 | 0.649 | 10 months→0.244 | 0.741 | 10 months→0.569 | Desiccator 30-33% RH |

FIG. 13

Sample 11, $\sigma$=1.60 nm

1100

LiF (23 nm)

AlF$_3$(XeF$_2$)

Al

Glass

Sample 09, $\sigma$=1.56 nm

1102

20 nm 0 nm

Sample 18B, σ=1.02 nm     FIG. 15B

| LiF (14 nm) |
| AlF₃ (XeF₂) |
| Al |
| Ti |
| Glass |

Sample accidentally sprayed with water

Sample 18A, σ=3.07 nm     FIG. 15A

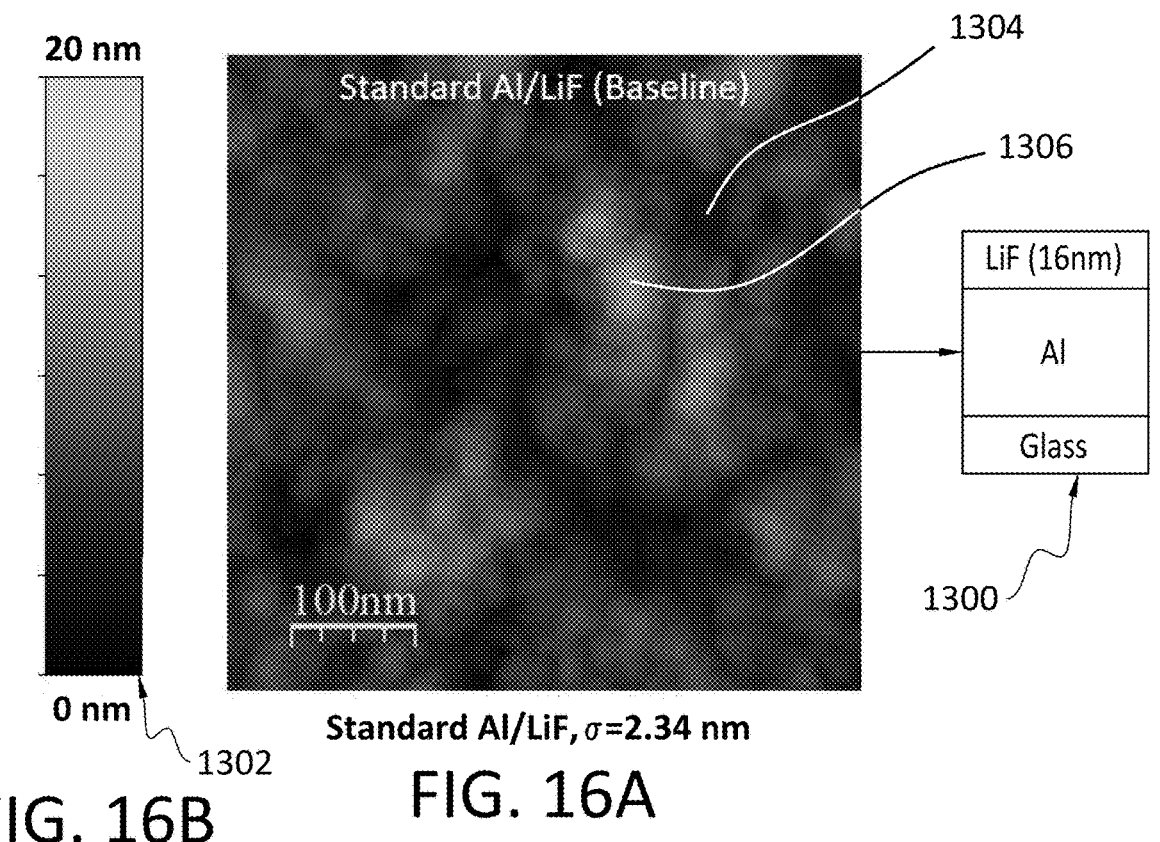
FIG. 16B
FIG. 16A
Standard Al/LiF, $\sigma$=2.34 nm
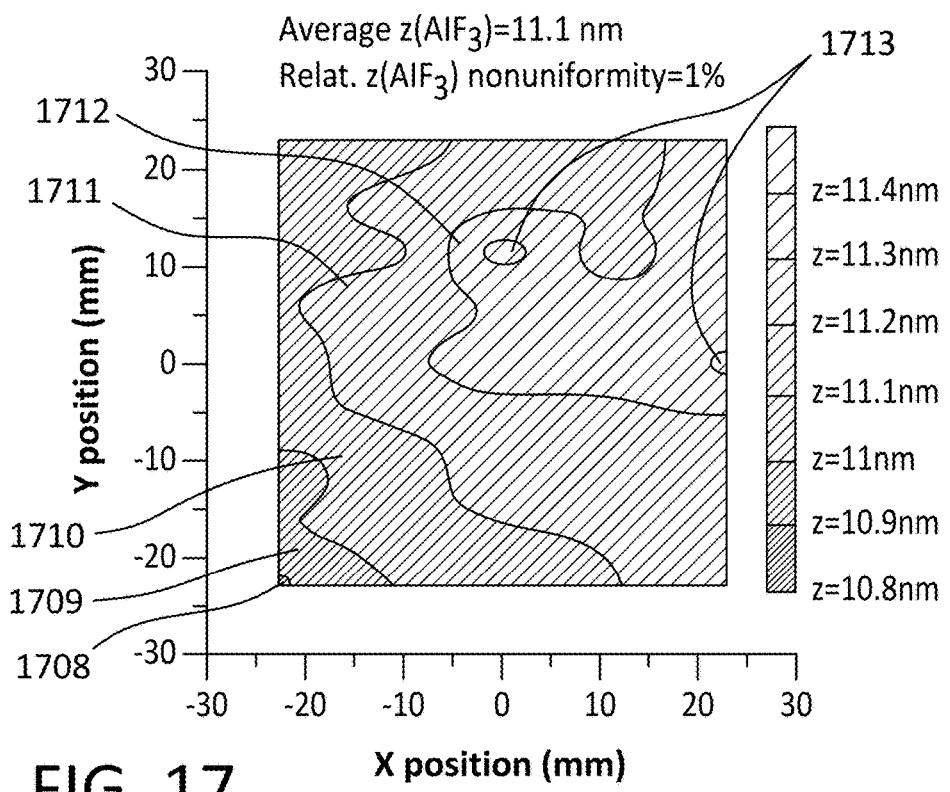
FIG. 17

ALUMINUM MIRRORS PASSIVATED WITH AN AlF₃ OVERCOAT AND METHODS OF MAKING AND USING THE SAME

CROSS-REFERENCE TO RELATED APPLICATIONS

This application is a continuation-in-part application of U.S. application Ser. No. 18/093,549 filed on Jan. 5, 2023, titled "Reactive Physical Vapor Deposition of Al Mirrors Protected with LiF Overcoat, Devices And Processes." The entire disclosure of the prior application is hereby incorporated by reference.

ORIGIN OF THE INVENTION

The invention described herein was made by employees of the United States Government, and may be manufactured and used by or for the Government for Government purposes without the payment of any royalties thereon or therefore.

FIELD OF THE INVENTION

This disclosure relates to a process for fabricating broadband Al mirrors protected with AlF₃ with high reflectance in the 100-2500 nm range. This disclosure further relates to a process for fabricating broadband Al mirrors protected with AlF₃ with high reflectance in the far ultraviolet (FUV) range, i.e., about 100-200 nm range, and, in particular, at about a 122 nm wavelength.

This disclosure further relates to a process for fabricating laminates with a passivated aluminum layer and a dielectric layer over the passivated aluminum layer. The aluminum layer is passivated with a thin AlF₃ layer between the aluminum layer and the dielectric layer.

BACKGROUND OF THE INVENTION

Pure Aluminum (Al) exhibits intrinsic high reflectance long-wards of 83 nm. However, Al coatings must be protected from its naturally occurring and absorptive oxide layer when exposed to air with a thin film of a transparent material for use <160 nm. Aluminum protected with fluorides such as AlF₃ or MgF₂ has provided the most commonly encountered solution to this concern, and LiF is commonly used when performance is required below 120 nm down to 100 nm. Below 100 nm and down to 90 nm, no transparent material is available to protect the Al and the achievable mirror reflectance stays below 40%. The two unique characteristics of the problem are that even above 100 nm, the reflectance of protected Al is limited by the residual absorption and the eventual degradation of the fluoride passivation layer overcoats. The Al/LiF technology was discovered about 60 years ago.

The performance of conventional Al+LiF degrades significantly when stored in humid environments as LiF is a hygroscopic material with finite solubility in water. This can lead to degradation of the optical surface through "ripening" (i.e., capillary penetration and etching by H₂O at grain boundaries) effectively increasing roughness of the surface and the porosity of coating media over time. As an example, the reflectance of freshly deposited Al/LiF coatings for the Far Ultraviolet Spectroscopic Explorer (FUSE) were about 70% in the short FUV wavelengths, but that reflectance decreased to about 55% by launch, despite the extensive use of nitrogen purging during processing the instrument payload. The degradation of Al/LiF mirrors exposed to air has been an issue since the first Al/LiF mirrors were fabricated. LiF aging is correlated with the relative humidity in the environment. Al/LiF mirrors in which LiF was deposited at higher temperature were more stable than those deposited at room temperature. The degradation of LiF can be mitigated by keeping the mirrors in a dry environment (e.g., inert purge such as Ar or N₂) or stored under vacuum throughout integration and testing. However, the complexity associated with maintaining these risk mitigation measures for optical systems can be prohibitive and therefore a means of permanently protecting the LiF from moisture exposure is preferable. Recently tested strategies to mitigate LiF degradation are mostly focused on either producing a denser and more compact protective layer. As an example, hot-deposited fluorides are denser than fluorides deposited at ambient temperature, and therefore, offer lower sensitivity to contaminants. Alternatively, overcoating the mirror with a passivation layer mitigates LiF degradation. Overcoating an Al/LiF mirror with a very thin layer of either MgF₂ or CaF₂, for example, would significantly enhance its stability. These two strategies (hot-deposition combined with a very thin fluoride overcoat) have recently been shown to improve the stability of the LiF passivation layer.

SUMMARY

In one embodiment, a method of forming a mirror device in a reaction chamber is provided. The method includes using a substrate which is positioned in the reaction chamber which is under vacuum; using Al that has been evaporated by physical vapor deposition using heated tungsten coils; exposing the substrate to the Al to form an Al layer thereon; exposing the Al layer to XeF₂ gas to form a layer of AlF₃ on the Al layer; and exposing the AlF₃ layer to a metal-fluoride dielectric gas evaporated using a heated molybdenum boat to form a layer of the metal-fluoride dielectric on the AlF₃ layer. This entire sequence needs to be done "in situ" (without breaking vacuum) to prevent the formation of aluminum native oxides.

In one embodiment, a method of forming a mirror device in a reaction chamber is provided. The method includes using a substrate which is positioned in the reaction chamber which is under vacuum; using Al that has been evaporated by physical vapor deposition using heated tungsten coils; outgassing pure Al inside the chamber to form a getter coating; exposing the substrate to the Al to form an Al layer thereon; exposing the Al layer to XeF₂ gas to form a layer of AlF₃ on the Al layer; and exposing the AlF₃ layer to a metal-fluoride dielectric gas evaporated using a heated molybdenum boat to form a layer of the metal-fluoride dielectric on the AlF₃ layer. This entire sequence needs to be done "in situ" (without breaking vacuum) to prevent the formation of aluminum native oxides.

In one embodiment, a method of forming a mirror device in a reaction chamber is provided. The method includes using a substrate which is positioned in the reaction chamber which is under vacuum; using Al that has been evaporated by physical vapor deposition using heated tungsten coils; outgassing the aluminum to form a getter coating on an inner wall of the first reaction chamber; exposing the substrate to the Al to form an Al layer thereon; exposing the Al layer to XeF₂ gas to form a layer of AlF₃ on the Al layer; exposing the AlF₃ layer to a metal-fluoride dielectric gas to form a layer of the metal-fluoride dielectric on the AlF₃ layer; and exposing the metal-fluoride dielectric layer to XeF₂ gas. This entire sequence needs to be done "in situ" (without breaking vacuum) to prevent the formation of aluminum native oxides.

In another embodiment, a mirror device is provided. The mirror device includes a substrate; an Al layer over the substrate; an $AlF_3$ layer over the Al layer; and a metal-fluoride dielectric layer over the $AlF_3$ layer. The method includes exposing the provided mirror to $XeF_2$ gas to fill the pores in the metal-fluoride dielectric layer with fluorine and thus passivate the said layer.

This reactive physical vapor deposition (rPVD) method of forming a mirror device offers some features that are not possible with a conventional physical vapor deposition (PVD) coating process. The present procedure has several advantages. First, this passivation technique produces state-of-the-art and environmentally-stable protected Al mirrors, whose average FUV performance has been demonstrated to surpass the best LiF-protected Al mirrors realized by PVD with a hot substrate up to date. Secondly, the entire process is carried out at ambient temperature. Third, this is a highly scalable process, limited only by the sizes of the coating chamber where the passivation (with $XeF_2$) and depositions of Al and LiF are carried out.

Various embodiments disclosed herein relate to a method of forming a passivated reflective laminate by positioning a substrate in a first reaction chamber; placing the first reaction chamber under vacuum with the substrate therein; depositing an aluminum layer on the substrate while maintaining the vacuum; exposing the aluminum layer to $XeF_2$ gas to form a layer of $AlF_3$ on the aluminum layer while maintaining the vacuum; and breaking the vacuum to obtain the passivated reflective laminate. In various embodiments, the aluminum layer and the layer of $AlF_3$ may be deposited at ambient temperature; and the layer of $AlF_3$ is a surface layer on the passivated reflective laminate. The substrate may be a glass, a ceramic, a metal, or a semiconductor.

In various embodiments, the aluminum layer is deposited on a glass substrate with appropriate surface finish and thermal-mechanical properties to realize a mirror in a waveband of interest. The aluminum layer may be deposited on a substrate other than glass. Suitable substrates include a ceramic oxide, a ceramic nitride, or a ceramic carbide. The aluminum layer may be deposited on a substrate which is metal or a semiconductor selected from the group consisting of silicon, germanium, gallium arsenide, gallium nitride, silicon carbide, or similar semiconductors.

Various embodiments disclosed herein relate to a method of forming a passivated reflective laminate by positioning a substrate in a first reaction chamber; placing the first reaction chamber under vacuum with the substrate therein; depositing an aluminum layer on the substrate while maintaining the vacuum; exposing the aluminum layer to $XeF_2$ gas to form a layer of $AlF_3$ on the aluminum layer while maintaining the vacuum; and breaking the vacuum to obtain the passivated reflective laminate. The $XeF_2$ gas is formed by sublimating $XeF_2$ solid. The $XeF_2$ gas may be formed by sublimating $XeF_2$ solid under low pressure, or by sublimating $XeF_2$ solid under vacuum. The Al layer may be exposed to the $XeF_2$ gas from about 3 to about 30 seconds after formation of the Al layer.

Various embodiments disclosed herein relate to a method of forming a passivated reflective laminate by positioning a substrate in a first reaction chamber; placing the first reaction chamber under vacuum with the substrate therein; depositing an aluminum layer on the substrate by physical vapor deposition at a rate of at least about 50 Å per second while maintaining the vacuum; exposing the aluminum layer to $XeF_2$ gas to form a layer of $AlF_3$ on the aluminum layer at a rate of about 0.1 Å per second to about 1 Å per second while maintaining the vacuum; and breaking the vacuum to obtain the passivated reflective laminate.

Various embodiments disclosed herein relate to a method of forming a laminate by:

positioning a substrate in a first reaction chamber;

placing the first reaction chamber under vacuum with the substrate therein;

depositing an aluminum layer on the substrate while maintaining the vacuum;

exposing the aluminum layer to $XeF_2$ gas at ambient temperature to form a layer of $AlF_3$ on the aluminum layer while maintaining the vacuum;

breaking the vacuum to obtain the passivated reflective laminate;

positioning the passivated reflective laminate in a second reaction chamber;

placing the second reaction chamber under vacuum with the passivated reflective laminate therein;

depositing a dielectric layer on the passivated reflective laminate; and breaking the vacuum and removing the passivated reflective laminate from the second reactor;

wherein the dielectric layer is a surface layer covering the layer of $AlF_3$.

The first reaction chamber and the second reaction chamber may be the same reaction chamber or different reaction chambers. The dielectric layer may be a metal fluoride dielectric layer, such as a layer of LiF, $MgF_2$, or $CaF_2$. The dielectric layer may be a ceramic dielectric layer.

In various embodiments, depositing the dielectric layer on the passivated reflective laminate includes:

depositing a first dielectric layer on the passivated reflective laminate while maintaining the vacuum; and depositing a second dielectric layer on the first dielectric layer while maintaining the vacuum;

wherein the first dielectric layer and the second dielectric layer have different refractive indexes.

In various embodiments, depositing the dielectric layer on the passivated reflective laminate includes:

depositing a first dielectric layer on a first region of the passivated reflective laminate; and depositing a second dielectric layer on a second region of the passivated reflective laminate;

wherein the first dielectric layer and the second dielectric layer have different refractive indexes.

Various embodiments disclosed herein relate to a mirror, including a substrate; an Al layer over the substrate; and an $AlF_3$ surface layer over the Al layer. The $AlF_3$ layer may have a thickness of between about 2.5 nm and about 3.2 nm. The Al layer has a thickness of between about 45 nm and about 150 nm.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIGS. 12 and 13 show tabular data indicating the effect of storage time and storage conditions on reflectance data of embodiments of the present disclosure;

FIGS. 15A and 15B show the results of the Atomic Force Microscopic (AFM) characterization of embodiments of the present disclosure;

FIG. 16A shows the results of the Atomic Force Microscopic (AFM) characterization of an aged Al/LiF mirror (baseline) fabricated with standard PVD;

FIG. 16B provides a scale useful for interpreting FIG. 16A;

FIG. 17 shows $AlF_3$ layer thickness of laminates with $AlF_3$ surface layers, prepared by various methods described in the present disclosure.

DETAILED DESCRIPTION

Figure 1:
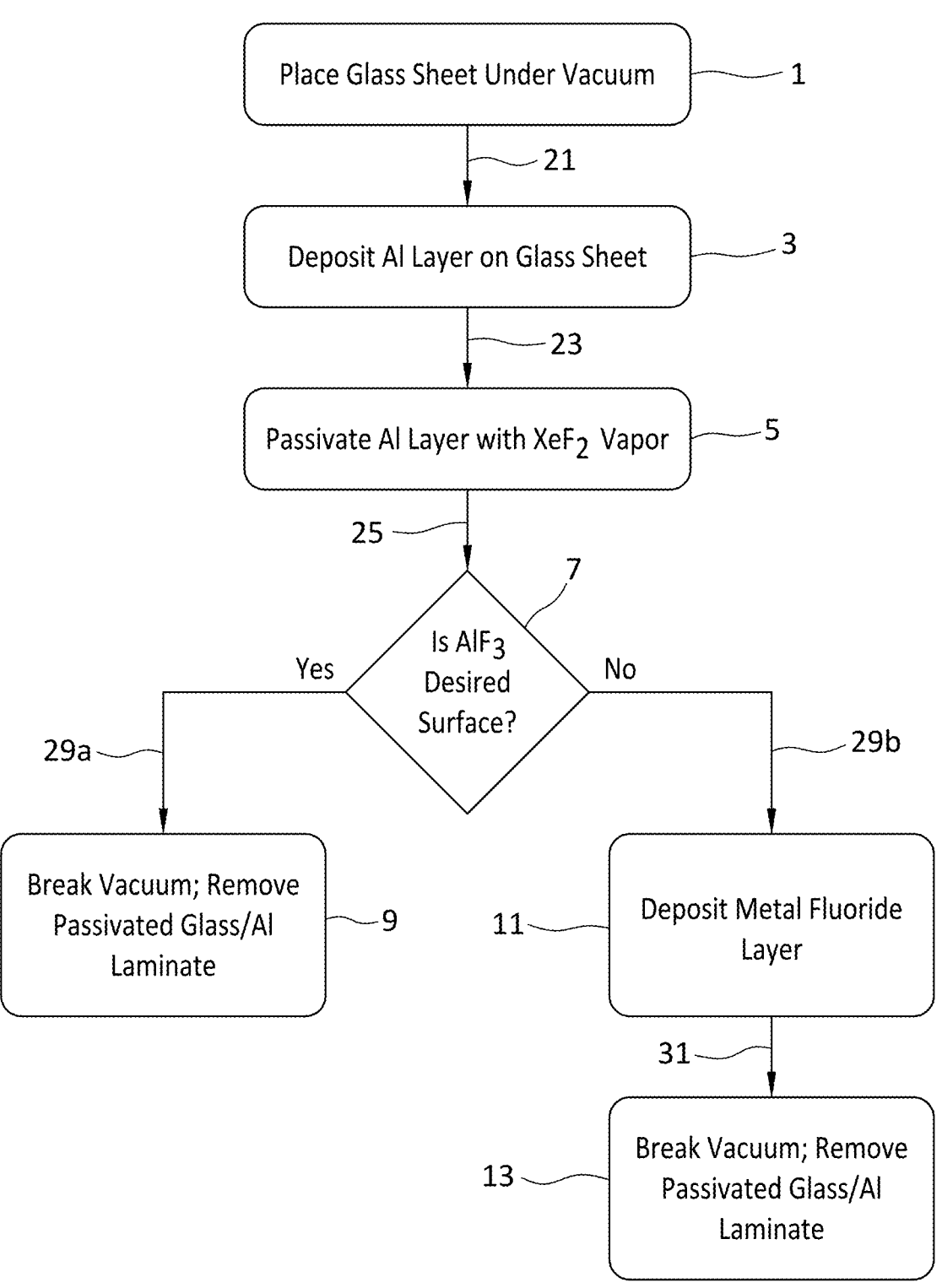
FIG. 1 is a flow chart showing processes for passivating aluminum layers on a substrate.

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s).

The use of the terms "a" and "an" and "the" and similar referents in the context of describing the elements (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in the specification should be construed as indicating any non-claimed element as essential.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that may vary depending upon the desired properties sought to be obtained by embodiments of the present disclosure. As used herein, "about" may be understood by persons of ordinary skill in the art and can vary to some extent depending upon the context in which it is used. If there are uses of the term which are not clear to persons of ordinary skill in the art, given the context in which it is used, "about" may mean up to plus or minus 10% of the particular term.

The terms "%", "% by weight", "weight %" and "wt %" are all intended to mean unless otherwise stated, percent by weight based upon a total weight of 100% end composition weight. Thus 10% by weight means that the component constitutes 10 wt. parts out of every 100 wt. parts of total composition.

The term "reflectance" is defined as the ratio of the radiant flux reflected from the surface of a material ($\Phi r$) to the incident radiant flux ($\Phi i$). Reflectance of a thin surface layer may vary with layer thickness. The term "reflectivity" is defined as the ability of a bulk material to reflect radiation. When the thickness of a layer of a defined material becomes sufficiently large, the observed reflectance of the layer becomes equal to the reflectivity of the defined material. Unless otherwise stated, "reflectance" and "reflectivity" will be treated as roughly synonymous for the purposes of this disclosure.

In some cases, properties of layers may be stated as numerical ranges. In some cases, layer thicknesses may be stated as numerical values, plus or minus one standard deviation $\sigma$, where a is the standard deviation of the surface height. The standard deviation of the surface height is the root mean square (RMS) deviation of surface height, or RMS roughness.

All of the embodiments included here are with the proviso that the sum of ingredients in the exemplary compositions does not exceed 100%.

Pure Aluminum (Al) exhibits an intrinsically high reflectance over the Large UV/Optical/IR (LUVOIR) Surveyor observatory target spectral range (90-2500 nm). However, in order to be used in spectral bands below 160 nm, Al mirror coatings require an optical thin film overcoat to prevent the formation of the naturally occurring $Al_2O_3$ oxide layer, which occurs upon exposure to oxygen. Aluminum protected with fluorides such as LiF or $MgF_2$ represent the most common solution to this challenge, but below 102 nm and down to 90 nm, no transparent coating material is able to protect Al from oxide formation while maintaining high reflectance. Typically, reflectance of a coated Al mirror is below 40% at wavelengths of 90 nm to 102 nm. Even above 102 nm, the reflectance of Al protected with a metal fluoride coating is limited by residual absorption of the fluoride overcoats.

The far-ultraviolet (FUV) reflectivity of standard Al coatings may be enhanced by preventing the oxidation of Al coatings through the exposure of freshly deposited Al layers to a reactive $XeF_2$ vapor immediately after application of a Physical Vapor Deposited (PVD) Al layer. This passivation process will result in the production of a thin $AlF_3$ layer, which is expected to offer higher transparency at short wavelengths than $MgF_2$-coated Al mirrors. Al mirrors passivated with a thin $AlF_3$ layer may permit higher Al-reflectance in the Lyman ultraviolet (LUV) spectral region, still maintaining over 90% reflectance at longer wavelengths. At the same time, $AlF_3$ is less hygroscopic than LiF. Therefore, $AlF_3$-coated Al mirrors may be more environmentally stable than to LiF-coated Al mirrors.

In various embodiments, a substrate, e.g., an optically smooth glass, is coated with Al in a high or ultra-high vacuum chamber by physical vapor deposition. Immediately after, the mirror is exposed to a reactive $XeF_2$ gas without reducing the vacuum, so as to prevent exposure of the mirror to environmental oxygen. The $XeF_2$ gas is typically formed by sublimating $XeF_2$ solid, where the solid is sublimated under pressure or under vacuum.

Exposure of freshly deposited Al layers to a reactive $XeF_2$ vapor to produce a passivated mirror offers some features that are not possible with the production of protected Al with a conventional PVD coating processes. First, this passivation technique produces passivated $Al/AlF_3$ mirrors whose FUV reflectance may surpass $AlF_3$-protected Al mirrors produced by conventional by Physical Vapor Deposition (PVD) at elevated temperature. Secondly, exposure of Al layers to a reactive $XeF_2$ vapor may be carried out at ambient temperature. Third, the techniques disclosed herein are highly scalable, limited only by the sizes of the coating chamber where Al passivation by $XeF_2$ is carried out. Finally, $XeF_2$ deposition is a conformal process that could be manipulated to adopt any desired geometry, including $XeF_2$ deposition on a planar, curved, or angular substrate. This implies that this procedure could be carried out or adopted for use on specialized optics, including concave mirrors, convex mirrors, planar mirrors, and corner reflectors.

As outlined above, the advantages of the present procedure are that the resulting optical mirrors are expected to be more efficient than conventional FUV mirrors, the treatment is carried out at ambient temperature, and this process is expected to be highly scalable for large-area optical elements.

Aspects of the present disclosure include depositing high-performance UV to FIR optical broadband coatings by designing/constructing a hybrid thin film deposition/fluorination chamber capable of depositing aluminum under ultra-high to medium vacuum with the capability of adding a precursor gas to fluorinate the surface and form a thin layer of aluminum fluoride ($AlF_3$) to protect the metal from oxidation. The thin $AlF_3$ layer will then be overcoated with a metal fluoride coating deposited using physical vapor deposition to achieve a controlled film thickness to enhance the mirror performance by optical interferential means.

Further aspects of the present disclosure include a laminated device (e.g., a mirror device) including an aluminum (Al) layer deposited on a substrate that is exposed to xenon di-fluoride ($XeF_2$) gas, followed by a lithium fluoride (LiF) overcoat which, in turn is exposed again to $XeF_2$ gas as well as multilayered embodiments formed during the process.

Furthermore, aspects of the present disclosure include Al mirrors protected with a flash LiF overcoat. Each of these Al and LiF layers are produced utilizing a room-temperature reactive Physical Vapor Deposition (rPVD) process that consists of exposing these films growth to a fluorine containing gas (e.g., $XeF_2$). Embodiments of the present disclosure include two sets of Al/LiF mirrors produced with this rPVD process. The first embodiment is optimized at a wavelength of 121.6 nm and presents an unprecedented reflectance of 92.6% at this wavelength. The second embodiment is optimized at shorter wavelengths by reducing the thickness of the LiF overcoat to have a more balanced reflectance performance in the far-ultraviolet (FUV) spectral range from 90-200 nm. Both embodiments present high reflectance in a spectral range from 90 nm up to the upper limit of the near infrared (2500 nm). This process of the present disclosure is observed to produce more durable and less hygroscopic mirrors than those fabricated with a standard physical vapor deposition (PVD) process and has utility in realizing an intrinsic high reflectance of aluminum in the critical FUV spectral range.

Various embodiments disclose the use of Al outgassing prior to depositing the Al and applying passivation. This step is for utilizing the Al as a getter coating before the Al deposition and $XeF_2$ passivation process. The Al coating inside the chamber will serve as a reactant for residual gases inside the chamber and limit residual gas capacity prior to beginning the passivation and rPVD processes.

Various embodiments disclosed herein relate to mirrors produced by exposing freshly deposited Aluminum (Al) coatings to $XeF_2$ vapor in-situ by a chemisorption process. In this process, the $XeF_2$ is adsorbed on the surface, and due to the affinity of Al for fluorine molecules, the weakly bound $XeF_2$ molecule dissociates. Xenon gas desorbs from the Al surface, and is pumped out of the chamber. Fluorine reacts with the Al surface coating. The result is that the Al coating is left with a thin $AlF_3$ overcoat layer, which prevents further oxidation. The resulting $Al/AlF_3$ film is a stable and high-reflectance optical coating for use in the far-ultraviolet (90 nm to 130 nm) spectral range.

Mirrors were produced and data were collected at NASA's Goddard Space Flight Center (GSFC) in the Thin Films Laboratory. The coatings were carried out in a 0.5-m diameter stainless-steel cylindrical deposition chamber. The chamber was pumped with a cryogenic system, and the fore vacuum was made with a rough pump. Base pressure of the chamber is $1.9 \times 10^{-8}$ Torr. Pure Al was evaporated from tungsten coils. The average Al deposition rates were greater than about 5 nm per second. The metal-fluoride dielectric (LiF) depositions were performed with a molybdenum bowl with a deposition rate ranging from 3.0 nm/s to about 9.6 nm/s. Film thicknesses were measured in-situ with a quartz-crystal monitor (QCM) that had been previously calibrated through stylus profilometry. The substrates were 50 mm×50 mm pieces of BK7 glass (microscopy slides); however, other common optically smooth amorphous glasses, ceramics, crystalline solids, and metals substrate materials can be utilized.

FIG. 1 shows a flow chart for manufacture of laminates according to the present disclosure. In step 1, a substrate is placed in a reactor under vacuum. The substrate may be a glass sheet as in FIG. 1. In certain embodiments, the substrate may be a semiconductor, a ceramic, a metal sheet, or a polymeric sheet. As alternatives to the aluminum layer, $XeF_2$ gas may be deposited on a substrate which is a ceramic oxide, a ceramic nitride, or a ceramic carbide. The aluminum layer may be deposited on a substrate which is a metal or a semiconductor. Suitable metals include metal sheets or foils, e.g., sheets or foils made of copper, silver, tin, gold, aluminum, or alloys thereof. Suitable semiconductors include silicon, germanium, gallium arsenide, gallium nitride, and silicon carbide.

Solid aluminum is vaporized by sputtering or thermal evaporation, and the aluminum vapor enters the reactor in step 21 without breaking the vacuum. In step 3, the aluminum vapor is deposited as a thin solid layer on the substrate without breaking the vacuum. Once a sufficiently thick aluminum layer has formed on the substrate, flow of vaporized aluminum into the reactor is ceased.

Solid $XeF_2$ is sublimated in step 23 by thermal evaporation, and the $XeF_2$ vapor enters the reactor without breaking the vacuum. $XeF_2$ is sublimated under vacuum, or under pressure. In step 5, the $XeF_2$ vapor reacts with the aluminum layer deposited on the substrate to produce an $AlF_3$ surface layer on the aluminum layer. Following $AlF_3$ deposition, $XeF_2$ vaporization is ceased, and $XeF_2$ vapor is withdrawn from the reactor in step 25.

Step 7 represents a decision point as to whether the $AlF_3$ layer is the desired surface layer on the aluminum-coated substrate. If the $AlF_3$ layer is the desired surface layer, vacuum is broken in step 29a and the substrate/Al/$AlF_3$ laminate is removed from the reactor in step 9. If the $AlF_3$ layer is not the desired surface layer, vacuum is maintained in step 29b and a further layer is deposited on the substrate/Al/$AlF_3$ laminate in step 11 without breaking the vacuum in the reactor. FIG. 1 shows deposition of a metal fluoride layer in step 11, although any dielectric material can be deposited on the substrate/Al/$AlF_3$ laminate. For example, step 11 may be replaced with a step of depositing a dielectric metal oxide layer, a dielectric metal nitride layer, or a dielectric metal carbide layer. Step 11 may also include sequential deposition of multiple dielectric layers. Following deposition of additional layers in step 11, vacuum is broken in step 31. In step 13, the coated substrate/Al laminate is removed from the reactor.

The process for preparing these Al+LiF mirror coatings utilizes exposure to $XeF_2$ gas before and after the Physical Vapor Deposition (PVD) of the LiF metal-fluoride dielectric. The technical description of the process is as follows:

First, bare optically smooth glass is coated with Al in a high vacuum chamber by PVD at the NASA GSFC. In the present process, the high vacuum chamber was baked out for several days at 100-105° C. before the deposition then the Al is outgassed forming a thin films in the inner chamber surround. Then, the bare Al mirror is immediately exposed to the reactive $XeF_2$ gas before and after the application of the flash evaporated LiF layer by conventional PVD. Therefore, the Al is exposed to $XeF_2$ within a few seconds after the aluminum evaporation, and typically the exposure lasts for 3 mins. The quick exposure of bare Al to $XeF_2$ produces a thin (≈2.5-3.2 nm, typical values measured through ellipsometry) protective layer of $AlF_3$. Once the mirror is complete, the LiF layer is exposed again to a high partial pressure of $XeF_2$ for a few seconds. An important detail is that all steps are carried out at ambient temperature and in situ without breaking vacuum conditions.

After the mirror coating fabrication, optical characterization is performed with a McPherson Vacuum Ultraviolet (VUV) 225 spectrophotometer. The estimated absolute reflectance error is ≤1%. FUV reflectance was measured immediately after deposition, and then again after several weeks of storage in a desiccator with a relative humidity of 40%. A HORIBA Jovin-Yvon spectroscopic ellipsometer operating in the 200-2500 nm range in a fixed configuration of 700 was used to obtain information about the thickness and optical properties of the $AlF_3$ layer resulting from exposing bare Al to $XeF_2$. Atomic force microscopy (AFM) was used to study the surface roughness, and measurements were performed using a Bruker Dimension Edge AFM system in tapping mode with 256 samples/line. The topography of each sample was acquired in two fields of 500 nm×500 nm and 5 μm×5 μm size.

The thicknesses of the dielectric layers deposited on the Al layer are controlled to provide a desired optical/electrical response and desired chemical passivation/aging properties for the targeted application. Each dielectric layer deposited on the Al layer should have a low and controlled surface roughness, where roughness is less than the shortest wavelength of interest to mitigate scattering losses in optical settings.

Figure 2:
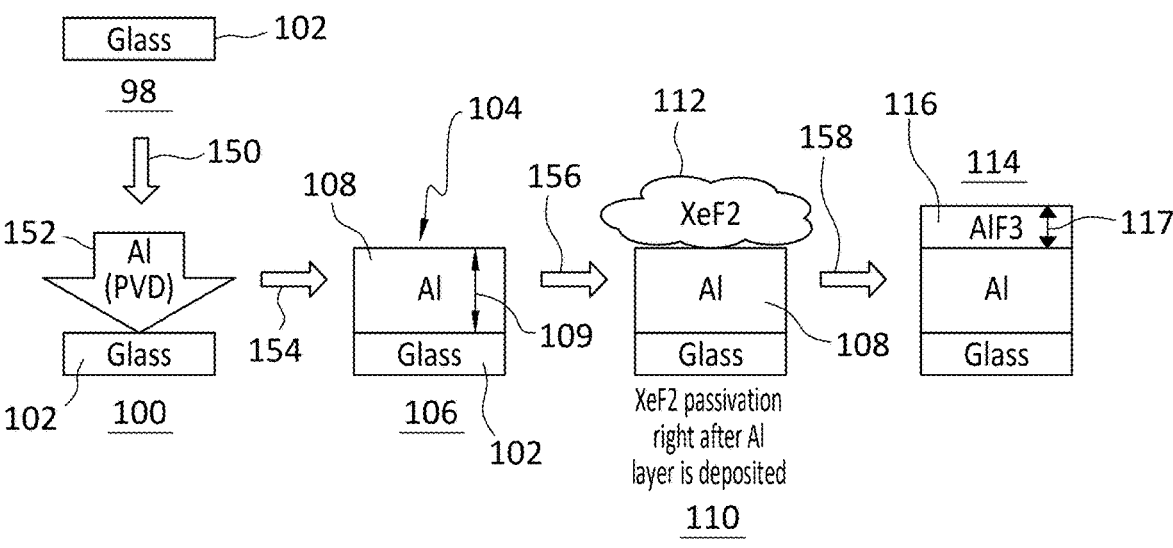
FIG. 2 is a schematic illustration of a first process embodiment and a first structural embodiment of the present disclosure.

Embodiments of the present disclosure are included in FIG. 2. In step 98, a substrate 102 (e.g., a piece of glass) is obtained. In step 150, the substrate 102 is placed in a reactor, and the reactor is placed under vacuum. In step 100, vaporized Al 152 is applied to an exposed surface of the substrate 102 using physical vapor deposition (PVD). In step 154, vaporized Al 152 deposits on substrate 102 to form an aluminum layer on the substrate. At step 106, a mirror 104 including substrate 102 and an Al layer 108 formed. Other substrates other than glass can include fused silica, nonporous lithium aluminum silicon-oxide material (Zerodur®), titania-silicate glass (ULE®), silicon carbide, alumina (synthetic sapphire), aluminum, beryllium, and other common optical substrates. Deposition of the aluminum layer can be performed in a vacuum range between about $1×10^{-7}$ Torr and about $1×10^{-12}$ Torr (typically ~$1.9×10^{-8}$ Torr). The Al layer 108 can have a thickness 109 of between about 45 nm and about 150 nm. The Al can be obtained by evaporating aluminum using, for example, coils formed of tungsten or another refractory metal that does not react with Al. The deposition rate can be equal or greater than about 50 Å per second.

In step 156 of FIG. 2, substantially pure or pure $XeF_2$ solid is evaporated by thermal evaporation or sublimation, and the $XeF_2$ vapor is allowed to enter the reactor. In step 110, the Al layer 108 is exposed to the $XeF_2$ vapor 112 in a dry-vacuum based reaction that requires no plasma or other activation, minimizing damage to the Al layer 108, passivating the Al layer. The Al layer 108 is exposed to the $XeF_2$ 112 for about 30 seconds to about 30 minutes, within a minimum of about 3 seconds and a maximum of about 30 seconds after formation of the Al layer 108. The $XeF_2$ 112 can be sublimated and controlled at pressures between $1×10^{-3}$ Torr and about 4 Torr, and the sublimated compound then exposed to the Al layer 108. Process step 110 is performed in a vacuum at between about $1×10^{-7}$ Torr and about 10 Torr (typically ~$1×10^{-4}$ Torr). The thickness rate of the passivation layer formed onto the Al layer 108 during the fluorination can be from about 0.1 Å per second to about 1 Å per second.

In step 158 of FIG. 2, vacuum on the reactor is broken. In step 114, the desired laminate is removed from the reactor. The product includes an $AlF_3$ surface layer 116 formed over the Al layer 108. The $AlF_3$ surface layer 116 can have a thickness 117 of between about 2.5 nm and about 3.2 nm.

The $AlF_3$ surface layer is stable against degradation or loss of reflectivity when stored at humidity levels of ~30-35%. Thus, the Al/$AlF_3$ laminate prepared by the process of FIG. 2 may be used as a mirror directly. Also, the Al/$AlF_3$ laminate has excellent surface smoothness and lacks an oxide coating. The Al/$AlF_3$ laminate may be stored until needed, and then placed in a reactor and coated by various chemical vapor deposition or physical vapor deposition techniques to produce a variety of optical laminates or electrical products.

In various embodiments, the Al/$AlF_3$ laminate is positioned in a reaction chamber; the reaction chamber is placed under vacuum; and a dielectric layer is positioned on the Al/$AlF_3$ laminate. The vacuum is then broken and the coated Al/AlF$_3$ laminate is removed from the reactor. The dielectric layer is a surface layer covering the layer of AlF$_3$. The dielectric layer may be a metal fluoride dielectric layer, e.g., a layer of LiF, MgF$_2$, or CaF$_2$. The dielectric layer may be a ceramic dielectric layer, e.g., a metal oxide, a metal nitride, or a metal carbide.

In various embodiments, the Al/AlF$_3$ laminate is positioned in a reaction chamber; the reaction chamber is placed under vacuum; and multiple dielectric layers are positioned on the Al/AlF$_3$ laminate. Depositing the dielectric layers may involve depositing a first dielectric layer on the Al/AlF$_3$ laminate while maintaining the vacuum; and depositing a second dielectric layer on the first dielectric layer while maintaining the vacuum. The first dielectric layer and the second dielectric layer may have different refractive indexes.

Through the use of masking, depositing the dielectric layers may involve depositing a first dielectric layer on a first region of the Al/AlF$_3$ laminate; and depositing a second dielectric layer on a second region of the Al/AlF$_3$ laminate.

Depositing the dielectric layers may involve depositing a first dielectric layer on Al/AlF$_3$ laminate; masking a first portion of the Al/AlF$_3$ laminate; removing the first dielectric layer from the exposed portion of the Al/AlF$_3$ laminate to expose a portion of the AlF$_3$ layer; and depositing a second dielectric layer on the exposed portion of portion of the AlF$_3$ layer and the remaining portion of first dielectric layer.

Figure 3:
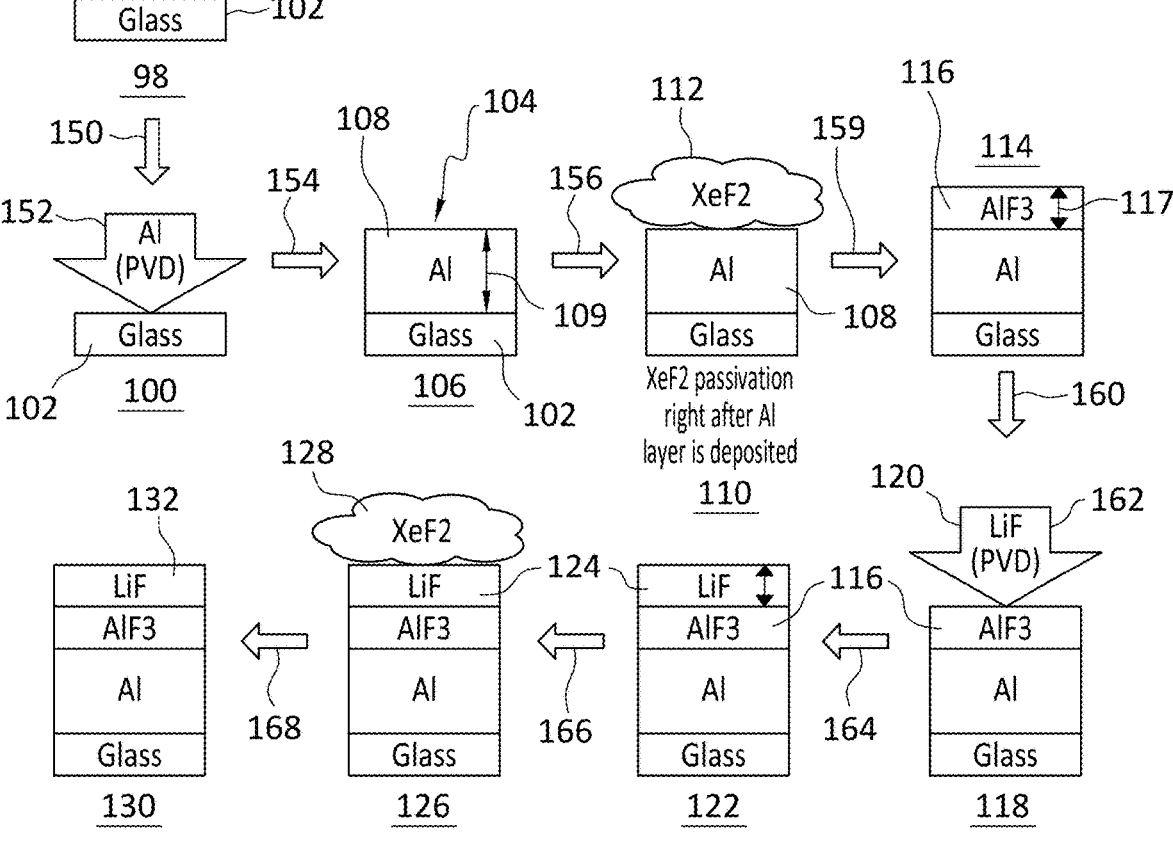
FIG. 3 is a schematic illustration of a second process embodiment and a second structural embodiment of the present disclosure.

Further embodiments of the present disclosure are included in FIG. 3. In step 98, a substrate 102 is obtained. In step 150, the substrate 102 is placed in a reactor, and the reactor is placed under vacuum. In step 100, vaporized Al 152 is applied to an exposed surface of the substrate 102 using PVD. In step 154, vaporized Al 152 deposits on substrate 102 to form an aluminum layer on the substrate. At step 106, a mirror 104 including substrate 102 and an Al layer 108 formed. In step 156 of FIG. 3, substantially pure or pure XeF$_2$ solid is evaporated by thermal evaporation or sublimation, and the XeF$_2$ vapor is allowed to enter the reactor. In step 110, the Al layer 108 is exposed to the XeF$_2$ vapor 112, passivating the Al layer. Up until this point, the process of FIG. 3 is identical to that of FIG. 2.

In step 159 of FIG. 3, vacuum is maintained in the reactor. The laminate in the reactor in step 114 includes the AlF$_3$ layer 116 with thickness 117 on Al layer 108. In step 160, a dielectric material, e.g., a metal-fluoride dielectric gas, is vaporized. The metal-fluoride dielectric gas may be formed from lithium fluoride (LiF), magnesium fluoride (MgF$_2$), aluminum trifluoride (AlF$_3$), or other fluorides. The metal fluorides can be sublimated by grinding the solid fluorides, and using a current to melt the fluorides in vacuum. The sublimated fluoride compound produces a vapor 120 (shown in FIG. 3 as LiF vapor) which is exposed to the AlF$_3$ layer 116 in step 118 to deposit a metal-fluoride dielectric layer. After a desired LiF thickness is deposited, the LiF vapor is removed in step 166. In step 122, the reactor contains a laminate with a glass substrate 102, an aluminum layer 108 over the substrate 102, an AlF$_3$ layer 116 over layer 108, and an LiF layer 124 over layer 116. The purity of the metal-fluoride dielectric layer may be greater than about 98%, 98.5%, 98.8%, 99.0%, 99.25%, 99.5%, 99.75%, or 99.9% to minimize strong UV absorption. The AlF$_3$ layer 116 is exposed to the metal-fluoride dielectric vapor 120 after formation of the AlF$_3$ layer 116 until the desired LiF layer thickness is reached. LiF deposition can be performed in a vacuum at between about $1 \times 10^{-12}$ Torr and about $1 \times 10^{-6}$ Torr. The deposition rate can be from about 30 Å per second to about 96 Å per second. The metal-fluoride dielectric layer 124 can have an optical thickness close to an optical quarter wave delay for the FUV wavelength at which the mirror is optimized, which translates into physical thicknesses of between about 12 nm and about 30 nm.

In step 166 of FIG. 3, substantially pure or pure XeF$_2$ solid is evaporated a second time, and the XeF$_2$ vapor is allowed to enter the reactor. In step 126, the metal-fluoride dielectric layer 124 is exposed to XeF$_2$ 128 similarly to step 110 for a period of from about 30 seconds to about 20 minutes. The metal-fluoride dielectric layer 124 is exposed to the XeF$_2$ 128 for a minimum of about 30 seconds and a maximum of about 20 minutes, about 3 to about 30 seconds after formation of the metal-fluoride dielectric layer 124.

Vacuum is then broken in step 168. The resulting multi-layered embodiment is then removed from the reactor in step 130. The final product includes LiF layer 132 over AlF$_3$ layer 116. Exposure to XeF$_2$ in step 126 results in a denser and smoother LiF surface, as deposition of fluoride from XeF$_2$ fills in gaps in the LiF crystal structure following LiF deposition in step 118.

Figure 4:
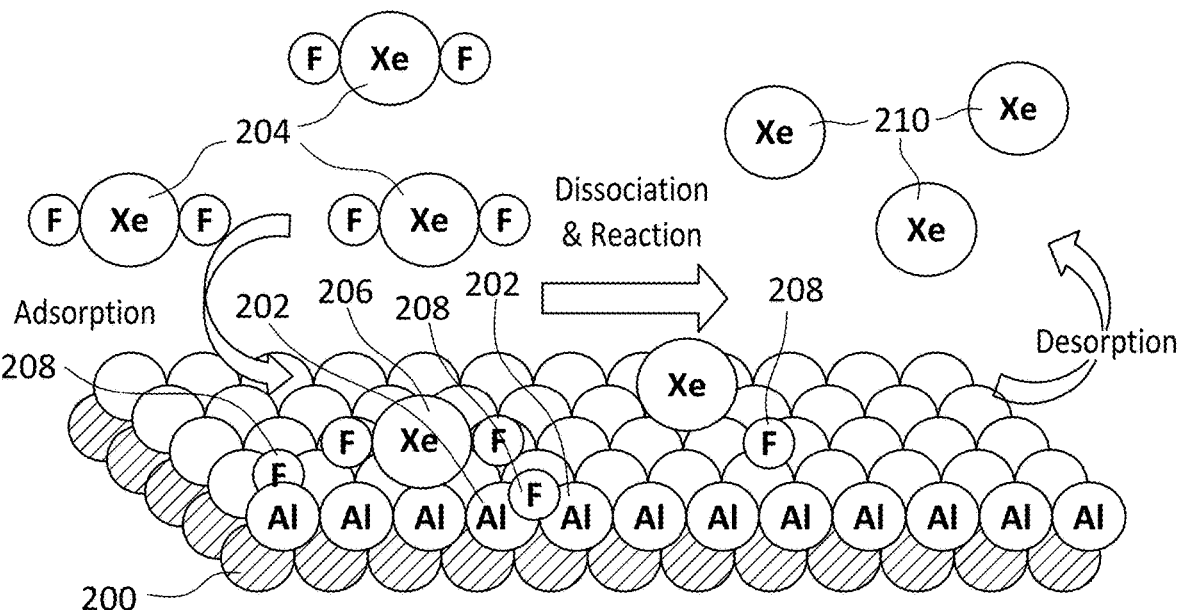
FIG. 4 is a schematic illustration of $AlF_3$ deposition during a step described in the present disclosure.

A schematic of aluminum fluoride deposition (step 110 in FIGS. 2 and 3) is illustrated in FIG. 4. In FIG. 4, there is a substrate 200 and an Al layer 202. The Al layer 202 is exposed to XeF$_2$ vapor 204. Molecules of XeF$_2$ are adsorbed from vapor 204 onto the Al layer 202 as adsorbed molecules 206. The adsorbed XeF$_2$ molecules 206 dissociate on Al surface 202, producing fluorine atoms 208 and xenon atoms 210. Fluorine atoms 208 undergo reaction with the Al surface layer 202 to produce an AlF$_3$ surface coating 116, as shown in FIGS. 2 and 3. The fluorine atoms 208 remain associated with the Al layer 202, and free xenon atoms 210 are desorbed from the Al layer 202 as a gas.

Figure 5:
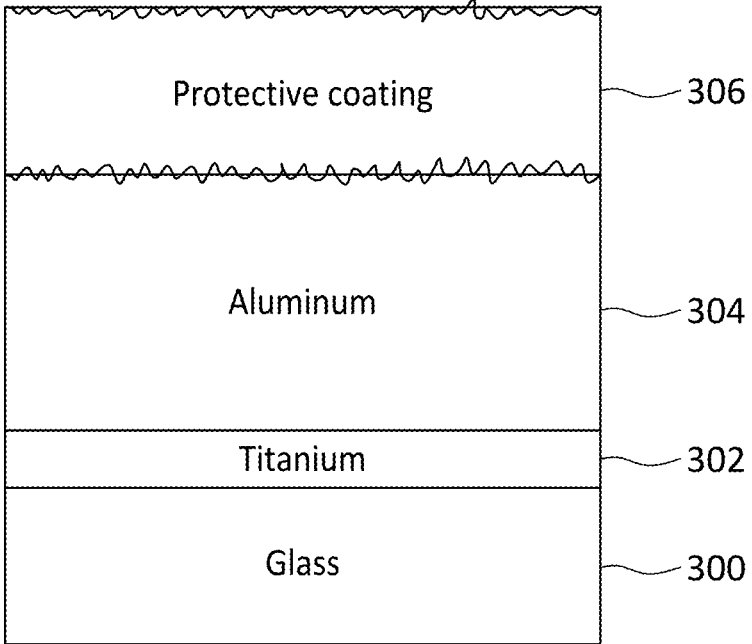
FIG. 5 is a schematic illustration of a third structural embodiment of the present disclosure.

Another embodiment of the present disclosure is illustrated in FIG. 5 which includes a substrate (e.g., glass) 301, a titanium (Ti) underlayer 302, an aluminum (Al) layer 304 and a protective coating 306. In various embodiments, protective coating 306 is a surface layer of AlF$_3$, prepared as described in FIG. 2. In various embodiments, protective coating 306 is a composite surface layer containing a lower AlF$_3$ layer and an LiF surface layer, prepared as described in FIG. 3. The Ti seed layer 302 may be applied to the substrate to improve interface adhesion and the coating reflectance by methods known in the art, including:

physical vapor deposition;
  sputtering, where microscopic particles from a solid target are ejected from the target surface after the target is bombarded by energetic particles of a plasma; or
  chemical vapor deposition techniques, including atomic layer deposition.

Figure 6:
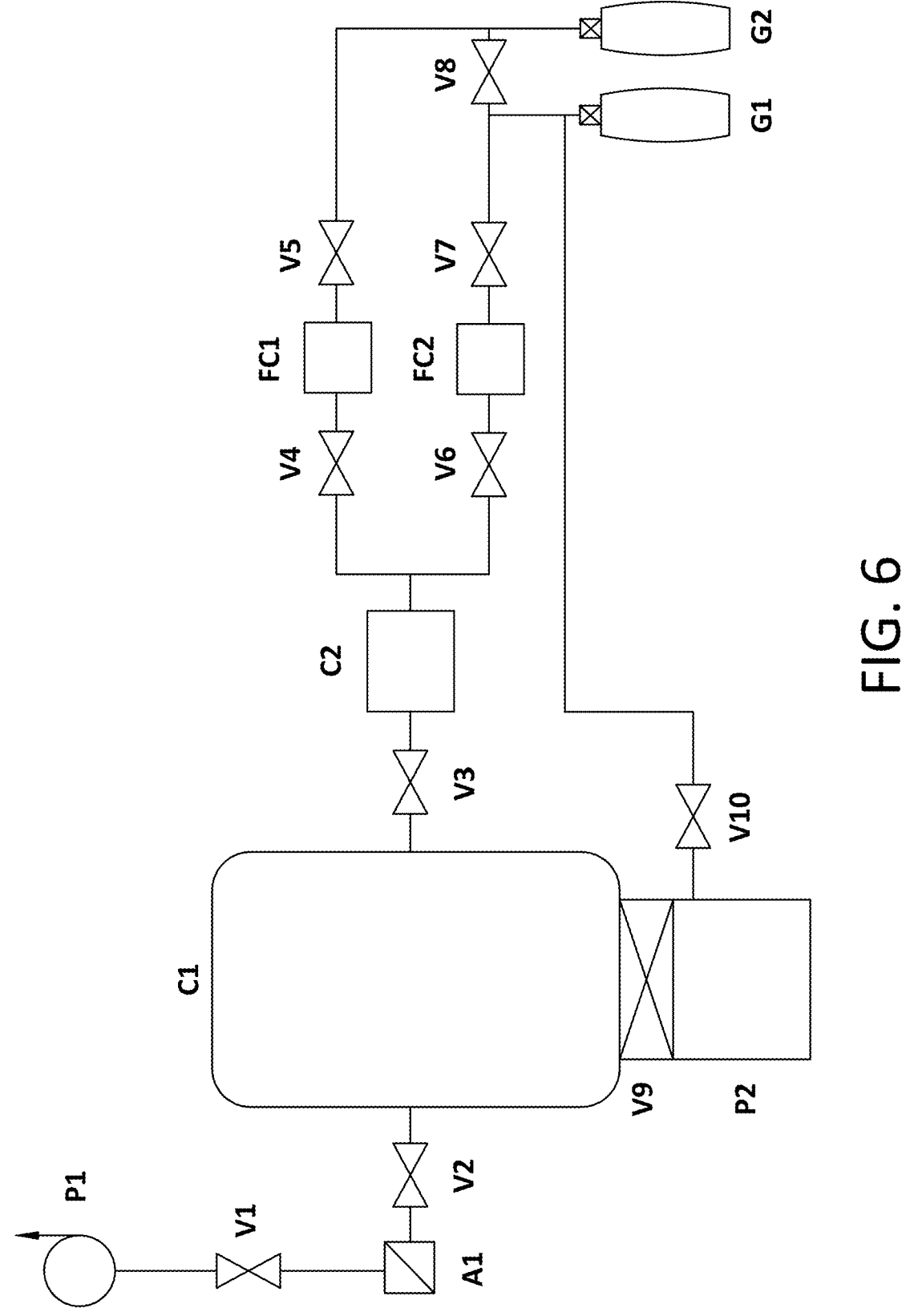
FIG. 6 is a schematic illustration of an apparatus used in carrying out various embodiments described in the present disclosure.

FIG. 6 is a schematic illustration of an embodiment including a coating chamber and related components in which method embodiments of the present disclosure are performed and object embodiments are made including use of reactive gas (XeF$_2$) delivered into coatings chamber using continuous or pulsed flow. The chamber is designed to be resistant to corrosive gases. The coating chamber and related components include:

a gas abatement A1;
  a high vacuum coating chamber/reactor C1;
  a gas expansion chamber C2;
  gas flow controllers FC1 and FC2;
  a reactive gas source (XeF$_2$) G1;
  a carrier gas (N$_2$) purge gas source G2;
  a rotary vane pump P1;
  a cryo-pump P2;
  a roughing valve V1;
  an isolation valve V2;

13
14 a passivation/chamber purge valve V3;

a downstream carrier/purge gas valve V4;

a upstream carrier/purge gas valve V5;

a downstream reactive valve V6;

an upstream reactive valve V7;

a carrier gas purge valve V8;

a high-vacuum valve V9; and a bypass valve V10.

The high vacuum coating chamber/reactor C1 is placed under vacuum using a two stage pumping system. The rotary vane pump P1 is activated followed by the roughing valve V1 and isolation valve V2 to place chamber under a medium vacuum. The gas abatement A1 is in line to both neutralize reactive gases and serve as a trap for the rotary vane pump P1. Once the coating chamber C1 reaches a medium vacuum, the rotary vane pump P1 is isolated from then coating chamber C1 and the high vacuum valve V9 and the cryo-pump P2 are activated to place the chamber C1 under high vacuum. In turn, the passivation chamber/purge valve V3, the downstream reactive valve V6, the bypass valve V10, and the upstream reactive gas valve V7 are activated to get the gas manifold tubing under high vacuum. Once the desired pressure is met on the coating chamber C1, the coating chamber C1 is ready for the passivation process which can be applied with either continuous flow or pulsed flow. Operating the chamber C1 in continuous flow involves leaving the passivation valve V3, the downstream reactive valve V6, and the high vacuum valve V9 open while closing the supplementary valves. The reactive gas flow is then controlled using the gas controller FC2 and the high vacuum valve which can also be used as a throttling valve. The carrier gas flow is controlled using gas flow controller FC1 and activating the downstream carrier gas valve V4 and upstream carrier gas valve V5. Additionally, operating the chamber C1 under pulsed gas flow mode involves activating only the upstream reactive gas valve V7. The downstream reactive gas valve V6 is then opened while the gas flow controller FC2 limits the gas going into the gas expansion chamber C2 to a desired pressure. Once the desired pressure is met, subsequent downstream reactive valve V6 closes and the passivation valve V3 is opened. The process is repeated until the desired amount of pulses are attained. The same procedure is also used when using a carrier gas as the upstream carrier gas valve V5 and the downstream carrier gas valve V4 are opened until the gas expansion chamber reaches a desired pressure percentage relative to the reactive gas; once this pressure setpoint condition is met for both the reactive gas and carrier gas in the expansion chamber C2, the passivation valve V3 is opened into the coating chamber C1. The process is repeated until the desired amount of pulses is attained. The process is finished when either a dwell time gas condition or pulsed gas condition is met. At the end of the process, all the reactive gas manifold lines are pumped by the cryopump P2 by opening the bypass valve V10. The carrier gas purge valve V8 is then opened to purge the gas lines and drive out the reactive gases.

Figure 7:
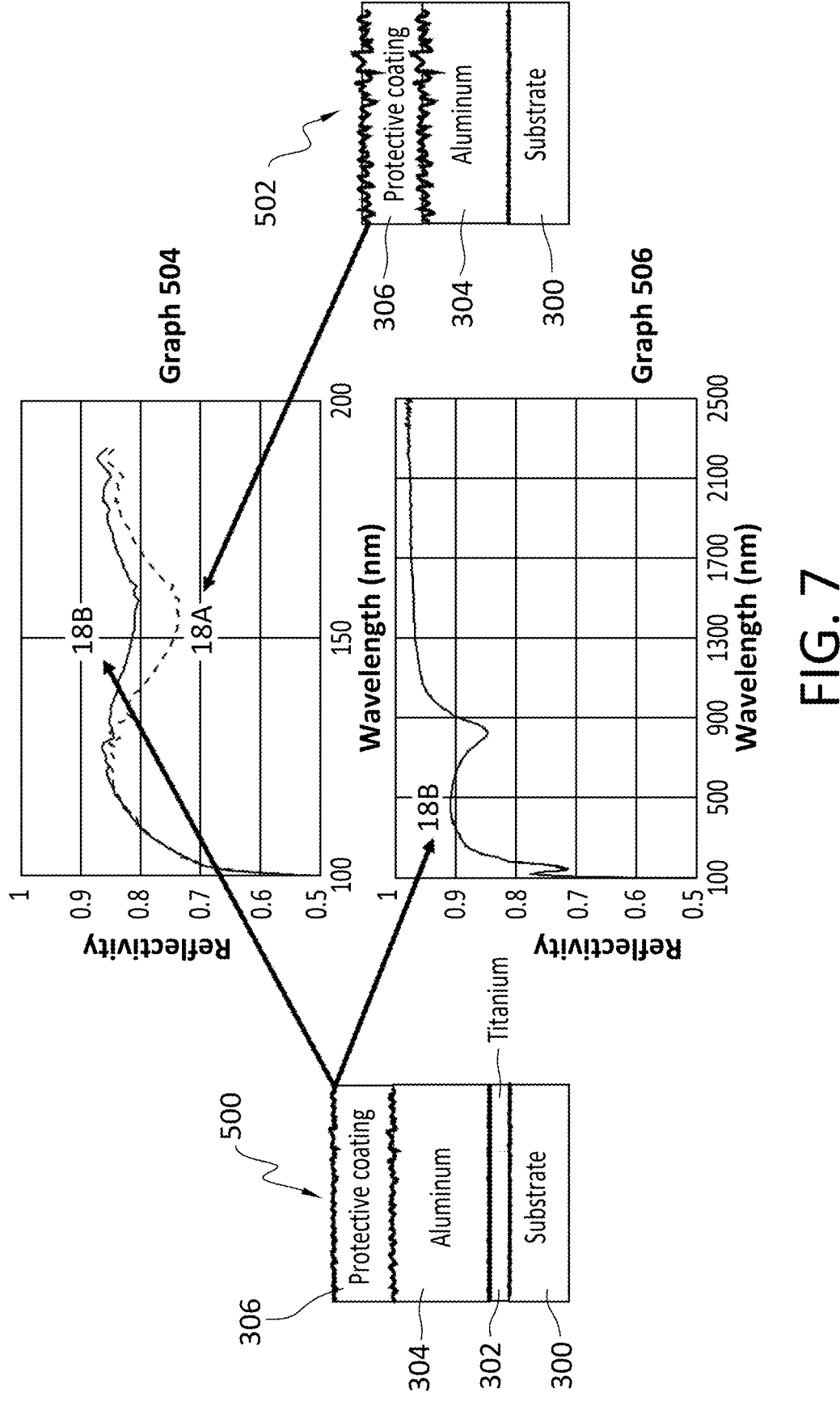
FIG. 7 shows reflectance of laminates with LiF surface layers, prepared by various methods described in the present disclosure.

FIG. 7 illustrates the reflectance as a function of incident wavelength of multi-layered embodiments with protective dielectric layers. Embodiment 500 (mirror 18B) is a mirror with a glass substrate 300, a titanium sublayer 302, an aluminum layer 304 and a protective dielectric passivation layer 306. Protective layer 306 includes:

an $AlF_3$ sublayer 116 of thickness between about 2.5 nm and about 3.2 nm, as seen in FIG. 3; and an LiF surface layer 124 of thickness of about 14 nm, as seen in FIG. 3.

Embodiment 502 (mirror 18A) is a mirror with a glass substrate 300, an aluminum layer 304, and a protective dielectric passivation layer 306 including $AlF_3$ sublayer 116 and surface LiF layer 124 with a thickness of about 14 nm; mirror 18A does not include titanium sublayer 302.

Both mirrors 18A and 18B were produced in the same coating run. Mirrors 18A and 18B present excellent FUV average reflectance of 79.7% and 82.5%, respectively. Graph 506 illustrates the broadband nature of the mirror 18B with the titanium underlayer 302 (embodiment 500). Mirror 18B has high reflectance in the 100 nm to 2500 nm spectral range. Besides, the use of a thin Ti sublayer 302 under the aluminum layer 304 has been shown to reduce the high Al frequency roughness due to modifications in the nucleation dynamics of Al. The use of a thin Ti under layer under the aluminum layer has also been shown to increase the reflectance of Al mirrors protected with a metal-fluoride layer ($MgF_2$) for the FUV Referring to FIG. 7, both mirror 18A of structure 502 and mirror 18B of structure 500 exhibit reflectance at 120-125 nm of ~85%. Both mirror 18A and mirror 18B exhibit a slight decline in reflectance between ~130 nm and 180 nm. Reflectivity of mirror 18A is reduced to ~73% at ~155 nm. Reflectivity of mirror 18B is reduced to ~80% at ~155 nm.

In order to reduce reflectance loses due to Al surface plasmon excitation and surface scattering to realize the high reflectance of Al, the following conditions have to be satisfied:

i. the crystallite size of the protective layer should be at least smaller than the minimum operational wavelength, and ii. the mirror surface root mean square (RMS) roughness should be at least smaller than $\frac{1}{20}$th of the minimum operational wavelength.

Graph 504 of FIG. 7 illustrates the reflectance differences between the sample 500 with Ti sublayer 302 (mirror 18B) and the sample 502 without Ti sublayer 302 (mirror 18A). The observed reflectance related to mirror roughness. Surface topography of both samples 500 and 502 (mirrors 18B and 18A) shown in FIGS. 12A and 12B show that both samples satisfied the aforementioned grain size and roughness conditions for high reflectance Al mirrors. However, mirror 18B is shown to be smoother and the grains are smaller than in mirror 18A, which translates into higher FUV reflectance. As shown in FIG. 15B, mirror 18B with Ti sublayer 302 has an LiF surface layer which is 14±1.02 nm thick (where the standard deviation σ of layer thickness R is 1.02 nm), while FIG. 15A shows that mirror 18A with no Ti sublayer 302 has an LiF surface layer which is 14±3.07 nm thick. Thus, the Ti sublayer 302 reduces the standard deviation σ of LiF surface layer thickness R by about a factor of 3, resulting in a smoother and more reflective surface layer.

Figure 8:
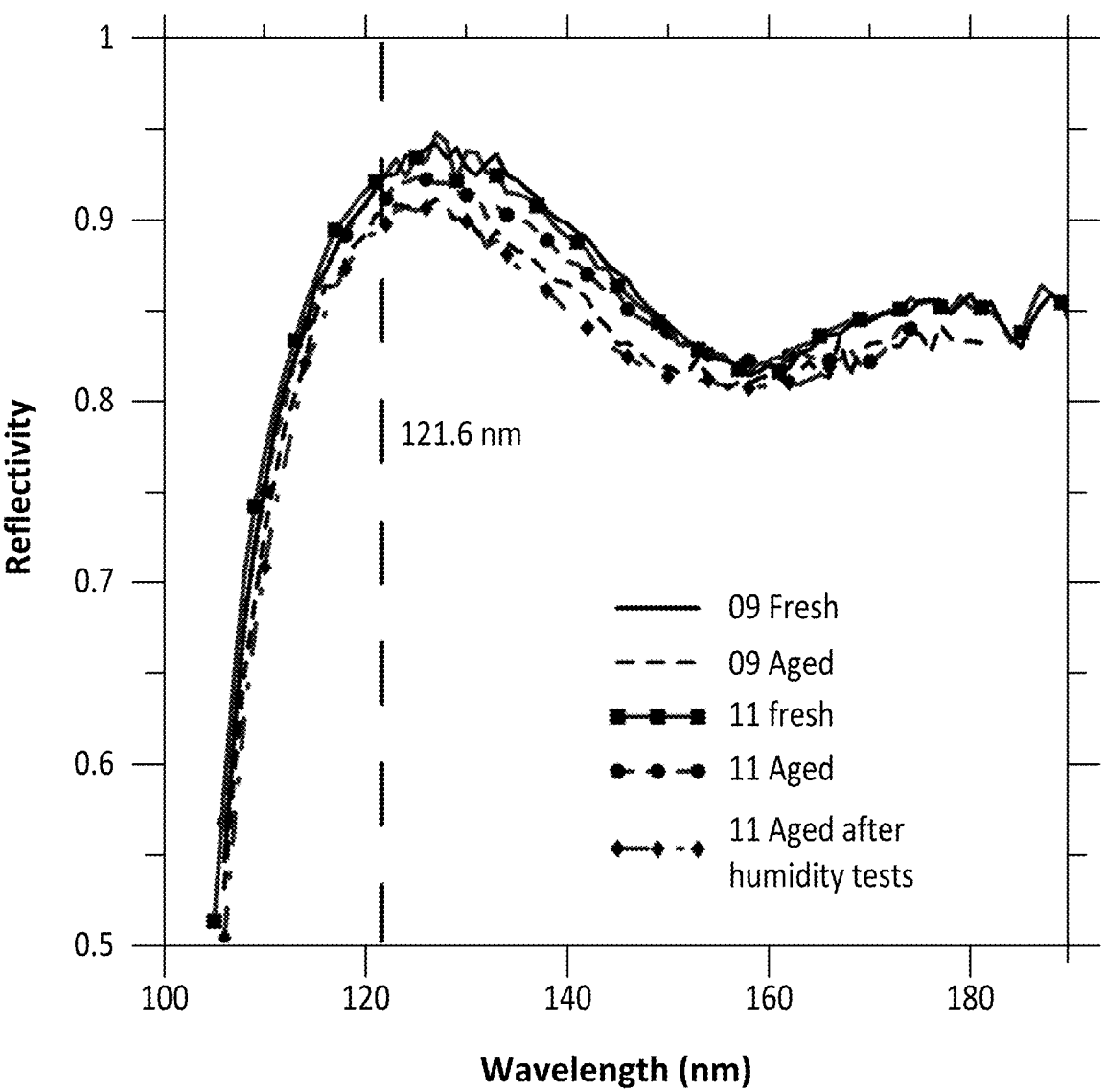
FIGS. 8 and 9 show graphic illustrations of the impact of time and storage conditions on reflectance data of embodiments of the present disclosure.

FIG. 8 illustrates reflectance versus wavelength for two samples 09 and 11 of Al/LiF mirrors fabricated with $AlF_3$ sublayers, using the room-temperature reactive Physical Vapor Deposition (rPVD) shown in FIG. 3. In FIG. 8, reflectance of samples 09 and 11 both fresh and aged (18 and 12 weeks, respectively) is shown. The LiF thicknesses of samples 09 and 11 are ≈22.9 nm and are optimized to provide high reflectance at the Hydrogen Lyman α line (121.6 nm), which is one important diagnostic for astronomy and is often used as a reference in the far ultraviolet. By using the rPVD method of FIG. 3, a reflectance of 92.6% was obtained at 122 nm wavelength, as shown in FIG. 8. This is the highest value of reflectance reported at this wavelength.

The processes described in the present disclosure involve metal fluoride deposition at ambient temperatures. Mirrors of the prior art have been prepared using metal fluoride deposition at elevated temperatures. $Al/MgF_2$ mirrors, where $MgF_2$ is deposited at high substrate temperatures demonstrated $\approx90\%$-91% reflectance at 122 nm. $Al/AlF_3$ mirrors, where $AlF_3$ is deposited at high substrate temperatures, demonstrated $\approx90\%$-91% reflectance at 122 nm. $Al/LiF$ mirrors, where LiF is deposited at high substrate temperatures, showed $\approx90\%$ reflectance at 122 nm.

Figure 9:
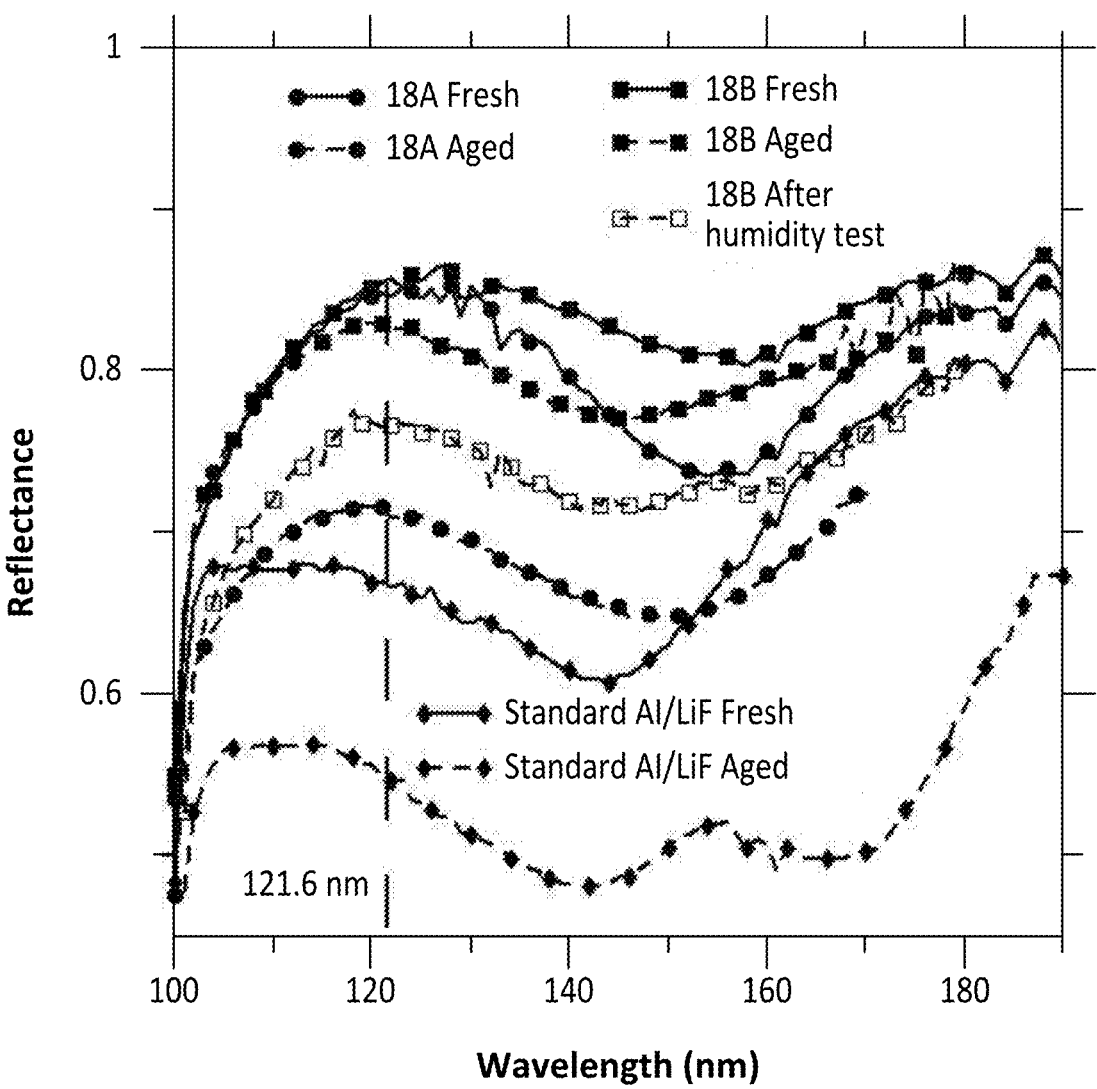

FIG. 9 illustrates reflectance versus wavelength of as-deposited and aged samples 18A (without Ti seed layer 302) and 18B (with Ti seed layer 302 located between the substrate 300 and the Al layer 304), along with a conventional Al/LiF mirror. A noticeable degradation in the aged reflectance of sample 18A is because the sample was accidentally sprayed with water. The mirrors in FIG. 9 (18A and 18B) were fabricated with a protective layer 306 containing:

a thin $AlF_3$ layer 116 with a 2.5 nm thickness on Al layer 304; and a thin LiF layer 124 with a 14 nm thickness on $AlF_3$ layer 116.

Layer 116 was deposited as a result of Al exposure to $XeF_2$. Samples 18A and 18B were particularly designed to meet the FUV reflectance targets for larger-aperture space telescope applications.

An analysis of the effects of the $XeF_2$ and the flash evaporation of LiF in the mirror quality was conducted. The effect of the LiF deposition rate on the reflectance and surface morphology of Al/LiF mirrors was studied. Mirrors in which LiF was deposited at 2 nm/s were smoother and more efficient in the VUV than those fabricated at 0.2 nm/s. The reflectance in the FUV of standard $Al/MgF_2$ mirrors increases linearly with the $MgF_2$ deposition rate. Additionally, it was found that a reflectance of 90.8% at 122 nm wavelength is achievable using high deposition rates of $MgF_2$. In embodiments of the present disclosure, high Al and LiF deposition rates were used to ensure good quality mirrors. But high LiF deposition rates alone cannot explain the reflectance values displayed in FIG. 8. Electromagnetic studies of the Al-fluoride interface show that any absorption occurring in the said interface has an important impact on the Al reflectance. The exposition of Al to $XeF_2$ immediately after the Al deposition grants a thin but highly protective $AlF_3$ layer that prevents Al from reacting with the residual gases, particularly with oxygen and water vapor.

In addition to water vapor, which leads to oxidation products through reaction with Al, incorporation of any oxygen during the coating process is problematic, and potentially limits to the achieved reflectance in the FUV. At its core, the challenge comes down to the task of forming a smooth surface on the mirror, and keeping the aluminum coating on the mirror from oxidizing. The reactive physical vapor deposition (rPVD) method disclosed herein achieves this task by tying up bonds on the Al surface with a passivation coating, where the passivation coating binds Al more tightly than oxygen or water vapor.

Moreover, the existence of an Al—F chemical bond in the interface between an Al layer and an LiF layer has been demonstrated using high-resolution synchrotron radiation photoemission spectroscopy. The exposure of bare Al to $XeF_2$ saturates the Al surface with fluorine, resulting in a thin barrier layer of $AlF_3$ that prevents a possible reaction between Al and LiF.

Figure 11:
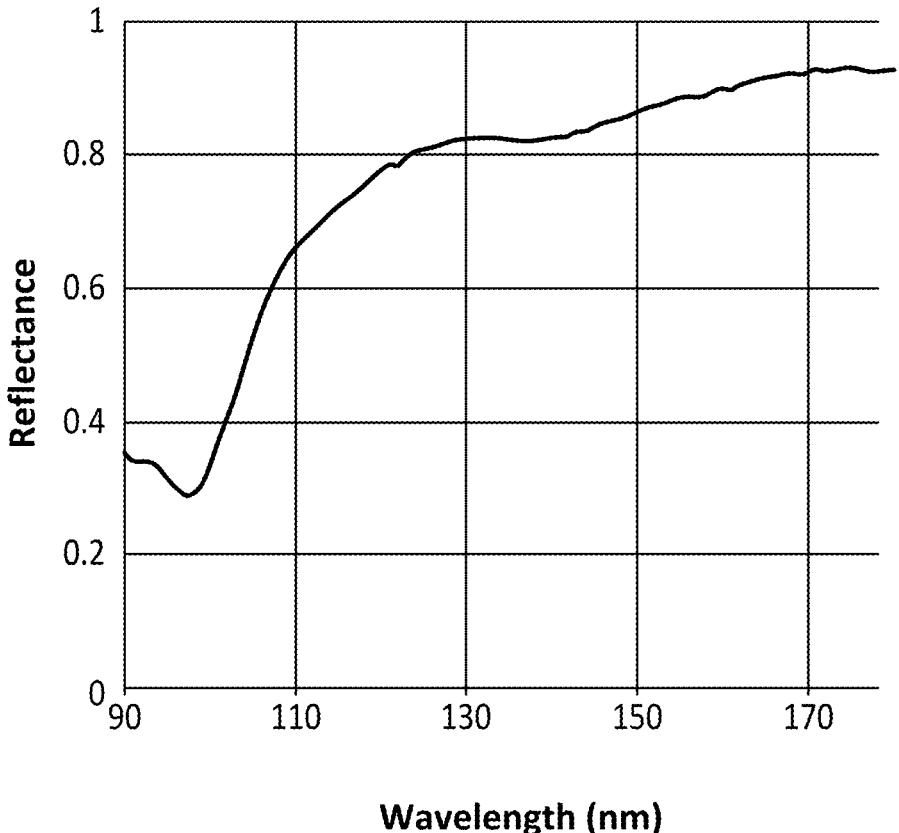
FIG. 11 shows reflectance of laminates with $AlF_3$ surface layers, prepared by various methods described in the present disclosure.

FIG. 11 shows reflectance versus wavelength for a mirror made by the process of FIG. 2, fabricated by direct deposition of an $AlF_3$ surface layer 116 on Al layer 108 using room-temperature reactive Physical Vapor Deposition (rPVD). The resulting mirror includes no LiF surface layer or Ti sublayer, and is therefore simpler to prepare than Al/LiF mirrors 18A and 18B. As seen in FIG. 11, the resulting $Al/AlF_3$ mirror has:

>40% reflectance at ~105 nm;

>65% reflectance at ~110 nm; and

~80% reflectance at ~125 nm to ~180 nm.

While the reflectance of the mirror of FIG. 11 is slightly lower than that of mirrors 18A and 18B at ~90 nm to 110 nm, as shown by a comparison of FIGS. 7 and 11, the mirror of FIG. 11 has very good to excellent reflectance in the far ultraviolet range from ~110 nm to ~180 nm. Additionally, as discussed above, mirror 18A and mirror 18B exhibit a slight decline in reflectance between ~130 nm and ~180 nm, as shown in FIG. 7. The mirror of FIG. 11 does not show any significant decline in reflectance in this range, as seen in FIG. 11. The mirror of FIG. 11 may offer a more uniform reflectance between −120 nm and −180 nm than the passivated Al/LiF mirrors 18A and 18B, while also offering the advantage of a simpler manufacturing process.

Data showing the stability of the Al/LiF mirrors (samples 09 and 11) is illustrated in FIG. 8. After storage for several months in a desiccator with a relative humidity of 30-35%, the reflectance of mirrors 09 and 11 at 122 nm wavelength decreased less than 2% (see the table in FIG. 12). The degradation of sample 09 is larger than of sample 11, partly because of the time-lapse between measurements (6 months versus 4 months), and because sample 09 was measured regularly in the first weeks following deposition, so that the sample was exposed several times for a few minutes to the laboratory environment with 70-75% relative humidity (RH). As seen in FIG. 12, sample 9 when freshly prepared had an RMS surface roughness of 1.56 nm and a reflectance R at 122 nm wavelength of 0.926. After six months of storage at 30-35% RH, sample 9 had R at 122 nm wavelength of 0.908, showing 98% of its initial reflectivity. Sample 11 when freshly prepared had an RMS surface roughness of 1.60 nm and R at 122 nm of 0.926. After 12 weeks of storage at 30-35% RH, sample 11 had R at 122 nm wavelength of 0.913, showing 98.6% of its initial reflectivity. After 13 weeks of storage at 30-35% RH and one week of storage at 50% RH, sample 11 had R at 122 nm wavelength of 0.914. After 13 weeks of storage at 30-35% RH, one week of storage at 50% RH, and two weeks of storage at 60% RH, sample 11 had R at 122 nm wavelength of 0.898, showing 97% of its initial reflectivity. Thus, mirrors prepared by the process of FIG. 3 have good storage stability.

Figure 10:
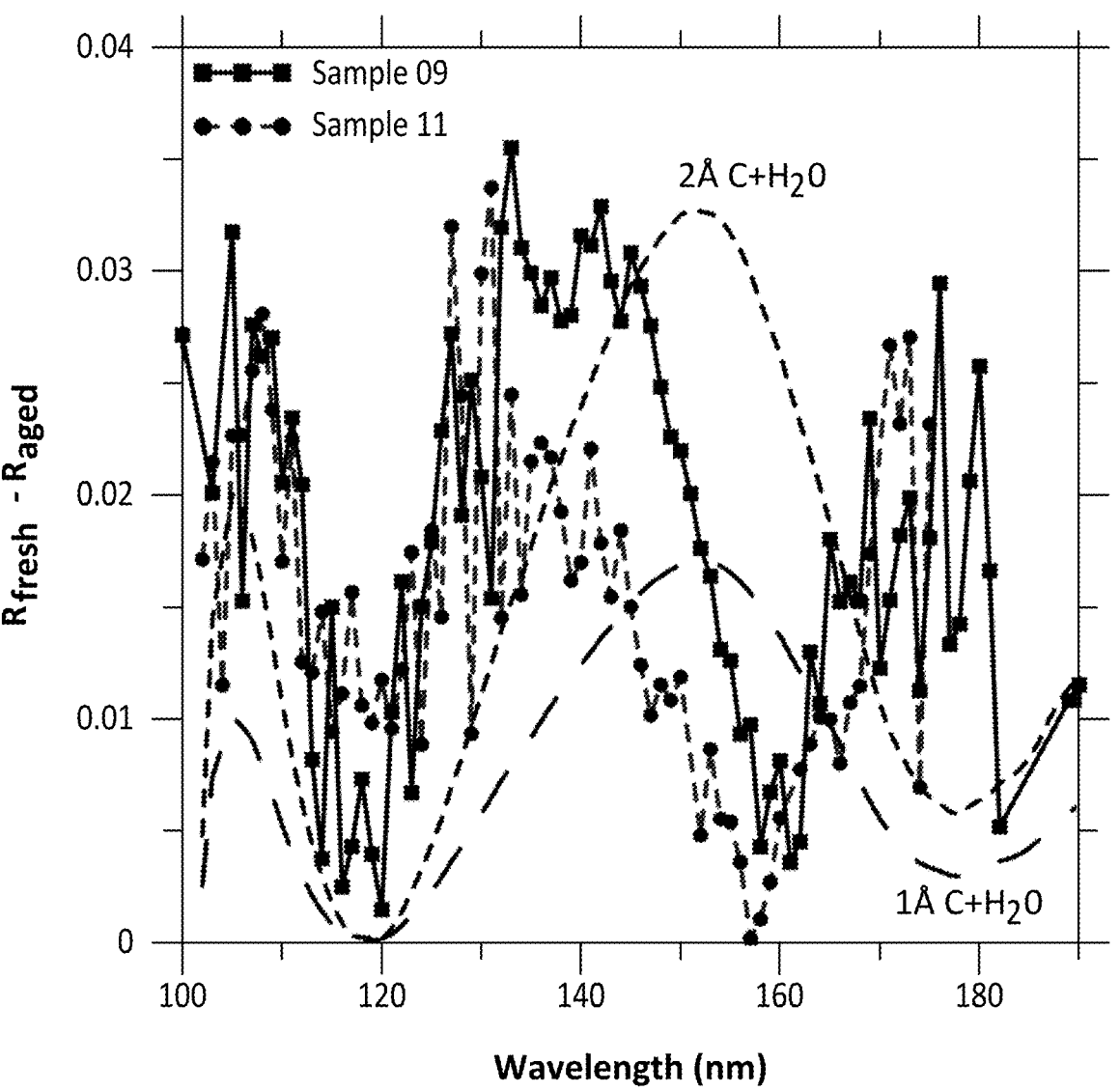
FIG. 10 is a graphic illustration of the reflectance decay data (i.e., "aging") of embodiments of the present disclosure.

The degradation of samples 09 and 11 (the latter before the humidity test) can be explained by the formation of a few hydrocarbons and/or water monolayers on the mirror surface. To support this hypothesis, FIG. 10 shows:

the reflectivity decay ($R_{fresh}$-$R_{aged}$) as a function of wavelength for samples 09 and 11 after storage at 30-35% RH, $R_{fresh}$-$R_{aged}$ of a model Al/LiF mirror with a 1 Å layer of a carbon and water mixture on top of the LiF surface layer (dashed line, long dashes); and $R_{fresh}$-$R_{aged}$ of a model Al/LiF mirror with a 2 Å layer of a carbon and water mixture on top of the LiF surface layer (dashed line, short dashes).

Despite the rough model, it somehow explains the degradation as a function of wavelength. The experimental reflectivity decay has a similar spectral shape as predicted in the model leads us to the intuitive conclusion that most of the decay is due to surface contamination. Plots of $R_{fresh}$-$R_{aged}$ as a function of wavelength for sample 09, which was periodically exposed to higher humidities, and the model Al/LiF mirror with a 2 Å $C/H_2O$ layer have similar amplitudes. Plots of $R_{fresh}$–$R_{aged}$ as a function of wavelength for sample 11, which was maintained at 30-35% RH, and the model Al/LiF mirror with a 1 Å $C/H_2O$ layer have reduced amplitudes, relative to sample 09.

Mirrors 18A and 18B also degraded over time (see FIGS. 9 and 13). Mirror 18B presented negligible reflectivity degradation at 103 nm wavelength, and a 3.7% reduction at 122 nm wavelength after 3 months of storage. The aging of mirror 18A could not be tested, as it was accidentally sprayed with a pear-shaped air blower that was used previously to suction tap water out from another apparatus. This caused the surface to be exposed to the tap water. The water was left to dry and this caused water marks to appear on the mirror surface (where water was noted to be present before drying).

Furthermore, samples 11 and 18B underwent an environmental resistance test. Sample 11 was exposed for one week to a constant relative humidity of 50%, and thereafter for two additional weeks at 60% RH. The temperature was kept constant at 25° C. The sample survived with a reflectivity drop of only 2% at 122 nm wavelength without the necessity of using high substrate temperatures during deposition, or of using an $AlF_3$ or $MgF_2$ overcoat. Sample 18B was also exposed to 50% RH and 25° C. for one week. However, an unintended exposure to relative humidity close to or above 100% for 30 minutes happened when sample 18B was being tested due to a failure of the humidity sensor in the environmental chamber. Despite this chamber failure, the sample presented no haziness and experienced a moderate decrease in reflectance (see FIG. 13). Although the purpose of the test was different, this accident demonstrates that the Al/LiF coatings produced through the rPVD process can survive a catastrophic exposure to water vapor for a moderate amount of time. Notably, the reflectance of the sample after this test is similar (if not better) to that of a freshly deposited conventional Al/LiF, as shown in FIG. 9. The utilization of high deposition LiF rates is expected to increase the packing density of LiF, and denser layers are more stable because they have less room for contaminants, particularly water. The use of $XeF_2$ could be playing an important role on the stability of these mirrors because the second in-situ exposure to a high-partial pressure of $XeF_2$ (~1 mTorr) of passivated Al mirrors may fill (or even saturate) the pores in the protective layer with fluorine. The latter will eventually be diffused through the protective layer until it reaches the Al. This effect may prevent Al from oxidation via oxygen diffusion, as the Al atoms accessible through pores in the protective layer are first filled with fluorine.

Figures 14A, 14B:
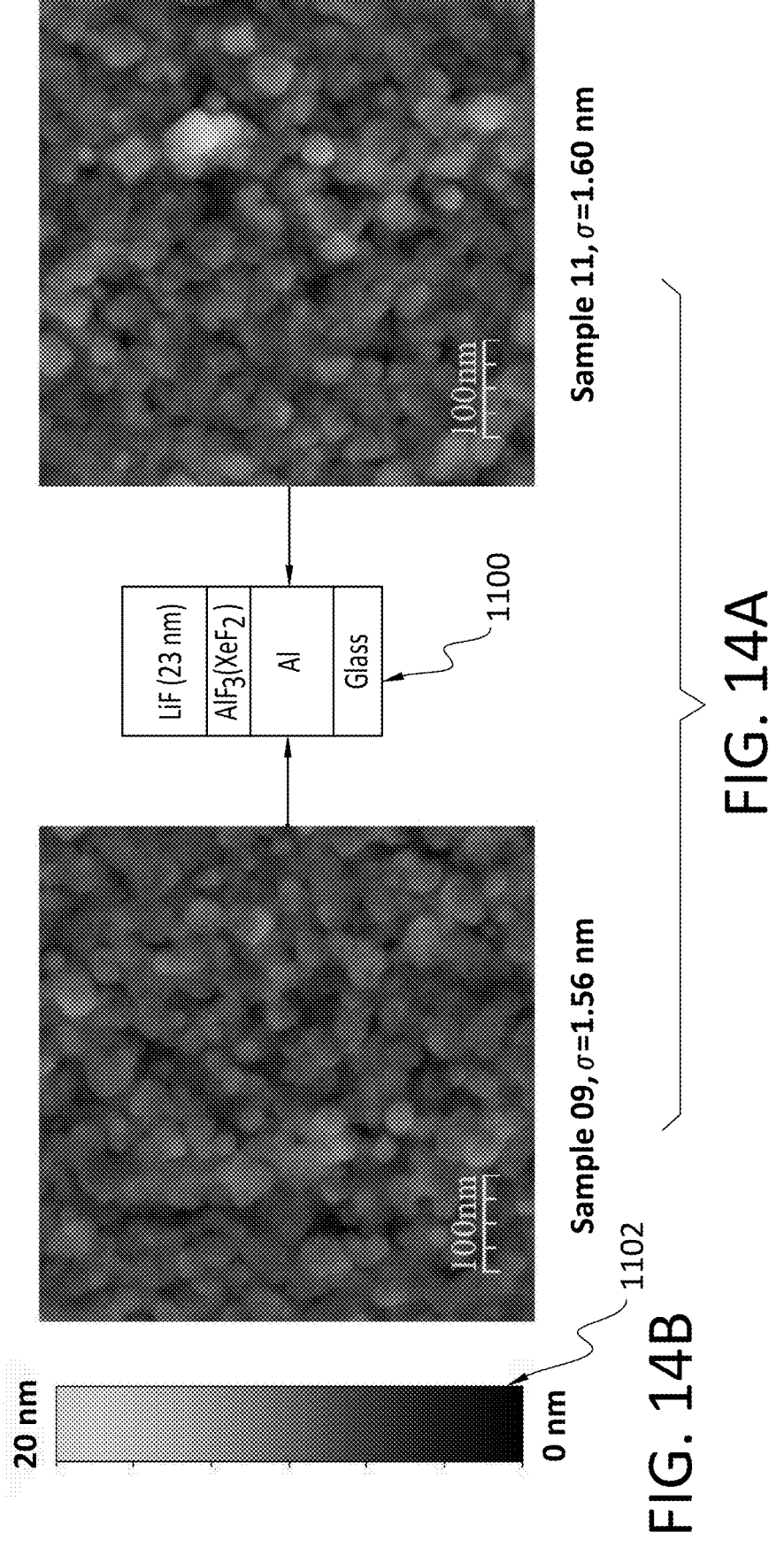
FIG. 14A shows the results of the Atomic Force Microscopic (AFM) characterization of embodiments of the present disclosure.
FIG. 14B provides a scale useful for interpreting FIG. 14A.
Figure 15C:
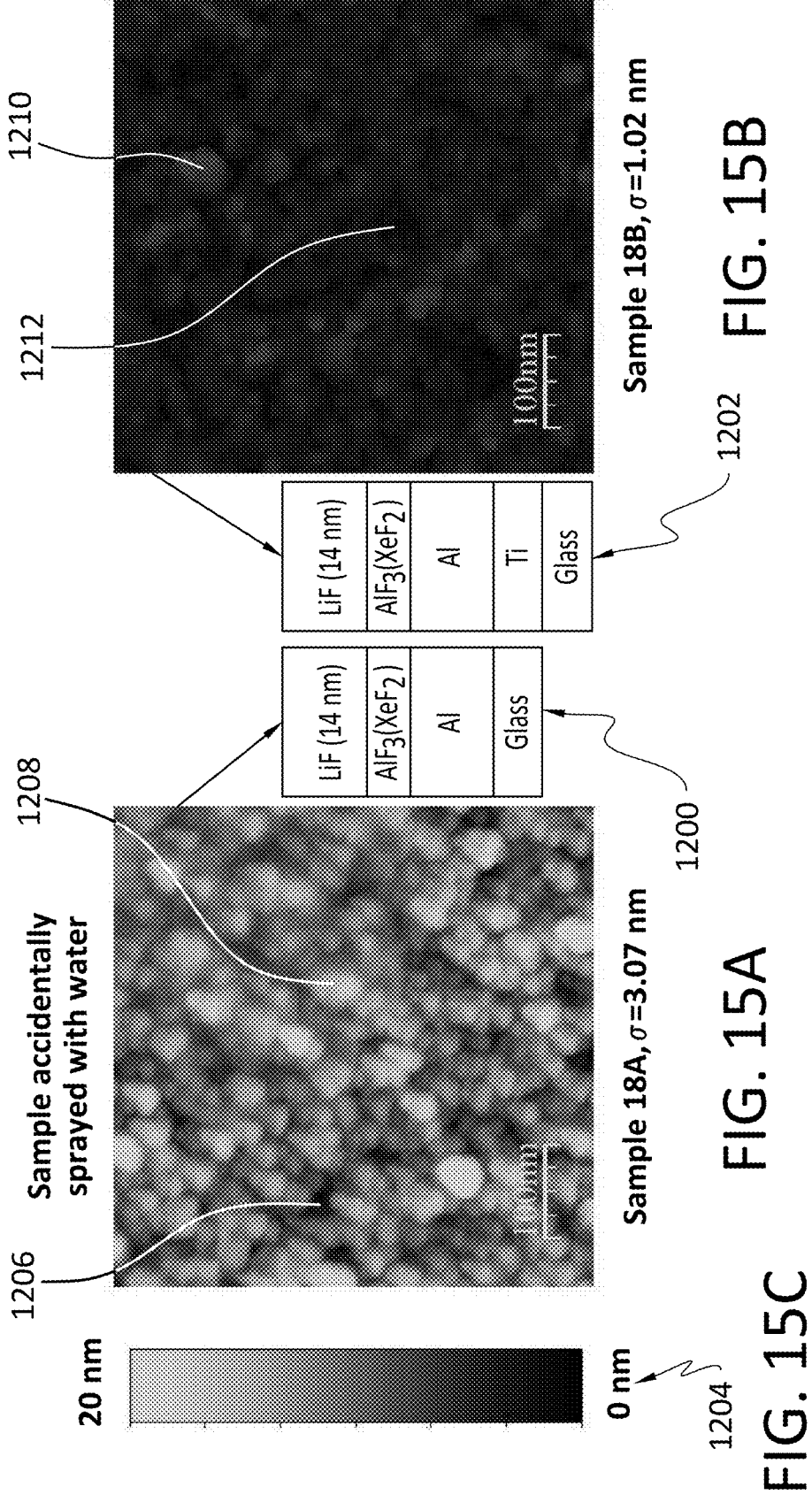
FIG. 15C provides a scale useful for interpreting FIGS. 15A and 15B.

FIGS. 14A, 15A, 15B and 16A show the results of the Atomic Force Microscopic (AFM) characterization performed on various sample mirrors, with FIGS. 14B, 15C, and 16B being provided as color bar scales, where thicker portions of the surface layer are lighter and thinner portions of the surface layer are darker.

The AFM surface topography scans (topographs) of aged samples 09 and 11 are included in FIG. 14A, for a 500 nm×500 nm region of each mirror. Aged samples 09 and 11 have structure 1100, with a glass substrate, an aluminum layer, a 2 to 3 nm thick $AlF_3$ layer, and a 23 nm thick LiF surface layer. FIG. 14B provides a color bar standard 1102 for analyzing the results in FIG. 14A. As seen in FIG. 14A, sample 09 has a surface LiF layer with a thickness of 23±1.56 nm, and sample 11 has a surface LiF layer with a thickness of 23±1.60 nm, based on the standard deviation σ of the surface layer thickness. Thus, samples 09 and 11 have substantially similar surface layer thicknesses and surface smoothness. The AFM topographs of samples 09 and 11 have a roughly similar appearance, as expected from the similarity of the LiF surface layers in the two samples.

The AFM topographs of samples 18A and 18B are included in FIGS. 15A and 15B. FIG. 15C provides a color bar standard 1102 for analyzing the results in FIGS. 15A and 15B. The AFM topograph of FIG. 15A relates to mirror 18A, having the structure 1200, with a glass substrate, an aluminum layer, a 2 to 3 nm thick $AlF_3$ layer, and a 14 nm thick LiF surface layer. As seen in FIG. 15A, mirror 18A has a surface LiF layer with a thickness of 14±3.07 nm, based on the standard deviation σ of the surface layer thickness. The AFM topograph of mirror 18A shows a large variation in surface thickness, where dark regions 1206 represent areas where the LiF layer is thin and light regions 1208 represent areas where the LiF layer is thick. The difference in height between regions 1206 and 1208 may approach 15-20 nm, based on a comparison with color bar 1204 of FIG. 15C. This indicates a significant degree of surface roughness.

The AFM topograph of FIG. 15B relates to mirror 18B, having the structure 1202, with a glass substrate, a Ti sublayer, an aluminum layer, a 2 to 3 nm thick $AlF_3$ layer, and a 14 nm thick LiF surface layer. As seen in FIG. 15B, mirror 18B has a surface LiF layer with a thickness of 14±1.02 nm, based on the standard deviation σ of the surface layer thickness. The AFM topograph of mirror 18B shows a small variation in surface thickness, where dark regions 1210 represent areas where the LiF layer is thinner and light regions 1212 represent areas where the LiF layer is thicker. However, the difference in height between regions 1210 and 1212 may be <5 nm, based on a comparison with color bar 1204 of FIG. 15C. This indicates a substantially reduced degree of surface roughness, compared to mirror 18A.

The AFM topograph of FIG. 16A relates to a comparative mirror without a passivating $AlF_3$ layer. The comparative mirror has the structure 1300, with a glass substrate, an aluminum layer, and a 16 nm thick LiF surface layer. As seen in FIG. 16A, mirror 18B has a surface LiF layer with a thickness of 16±2.34 nm. The AFM topograph of the comparative mirror 1300 shows a significant variation in surface thickness, where dark regions 1304 represent areas where the LiF layer is thinner and light regions 1306 represent areas where the LiF layer is thinner. The difference in height between regions 1304 and 1306 may approach 15 nm, based on a comparison with color bar 1302 of FIG. 16B. This indicates a significant degree of surface roughness, although the roughness of the comparative mirror 1300 appears to be lower than that of mirror 18A, as depicted in FIG. 15A.

The first $XeF_2$ exposure, prior to LiF deposition, may have smoothing effects on the LiF surface layer. The thin passivation layer resulting from immediate exposure of the Al layer to $XeF_2$ may be responsible for maintaining and/or enhancing the smoothness of the Al surface by perhaps limiting the residual mobility of Al atoms and hence, hindering the growth of Al crystals.

Samples have the structure 1100 of FIG. 14A, when prepared by deposition with the rPVD process of FIG. 3 at ambient temperature, present a surface roughness (RMS) of ≈1.6 nm. As shown for mirror 18B of FIG. 15B, RMS surface roughness is further reduced to ≈1 nm when a Ti seed layer is used between the substrate and the Al layer. These values are significantly lower than the ≈2.3 nm roughness of the comparative Al/LiF mirror of structure 1300 of FIG. 16A, where mirror 1300 is produced with a conventional PVD process using similar Al and LiF evaporation rates.

FIGS. 14, 15A and 15B depict examples of AFM topography taken from Al/LiF mirrors with a passivating $AlF_3$ layer between the Al and LiF layers. Sample scans were 500 nm×500 nm, but this is just the projected area. As the samples have topography, their real area is larger. The key factor is that a higher surface roughness means more LiF surface exposed to air, so that samples deposited through the rPVD process may be more stable because they are smoother, and hence there is less LiF surface exposed to water vapor.

The achieved surface roughness does not appear to have a significant impact on the reflectance at the short FUV wavelengths. As can be seen in FIG. 9, samples 18A and 18B have similar reflectance R below 115 nm. Referring to the table of FIG. 13, the RMS surface roughness of mirror 18B and the RMS surface roughness of mirror 18A differ by a factor of 3. However, both mirror 18A and mirror 18B have substantially identical reflectance R at 103 nm (prior to storage). However, the mirror 18A has a reduced reflectance at ~130 nm to ~180 nm, compared to mirror 18B, as shown in FIG. 7. The lower reflectance of mirror 18A in this range may be due to its increased surface roughness.

As discussed above, reflectance losses due to Al surface plasmon excitation can be controlled if the mirror surface root mean square (RMS) roughness is small, compared to the minimum operational wavelength. The increased surface roughness of mirror 18A, relative to mirror 18B, appears to lead to a reduced reflectance at 130 to 180 nm, due to increased Al surface plasmon excitation.

FIG. 17 shows surface thickness variations for a mirror made by the process of FIG. 2, fabricated by direct deposition of an $AlF_3$ surface layer 116 on an Al layer 108 using rPVD. FIG. 17 plots surface position in the x- and y-directions in mm for a mirror having an area of 50 mm². At each point on the mirror surface, thickness of the $AlF_3$ surface layer 116 in the z-direction, orthogonal to the mirror surface, is represented colorimetrically, with reference to the accompanying color bar scale. As shown in FIG. 17, the $AlF_3$ surface layer 116 has an average thickness in the z-direction $[z(AlF_3)]$ of 11.1 nanometers. Large proportions of $AlF_3$ surface layer 116 are made up of:

a first region 1710 with a layer thickness ranging from 11.0 to 11.1 nm;

a second region 1711 with a layer thickness ranging from 11.1 to 11.2 nm; and a third region 1712 with a layer thickness ranging from 11.2 to 11.3 nm.

Regions 1713 are small, compared to regions 1710-1712, and have a layer thickness ranging from 11.3 to 11.4 nm. Regions 1708 and 1709 are similarly small, compared to regions 1710-1712, and together have a layer thickness ranging from 10.8 to 10.9 nm. The non-uniformity of the $AlF_3$ surface layer thickness is about 1%. The $AlF_3$ surface passivation layer non-uniformity obtained in the 50×50 mm² sample area is unprecedented, and cannot be obtained through a conventional process involving PVD deposition of $AlF_3$ at elevated temperature.

As discussed above, mirrors 18A and 18B exhibit a slight decline in reflectance between ~130 nm and 180 nm, as shown in FIG. 7. The degree of this decline in reflectance correlates with roughness of the LiF surface layer in mirrors 18A and 18B. As demonstrated in FIG. 17, an Al/AlF₃ mirror made by a single step of direct deposition of an $AlF_3$ surface layer 116 on an Al layer 108 using rPVD has an extremely smooth surface, with an extremely low non-uniformity of surface thickness. Based on the high smoothness of the Al/AlF₃ mirror of FIG. 17, it would be expected that little or no loss of reflectance would be observed between ~130 nm and 180 nm. Referring back to FIG. 11, it is observed that an Al/AlF₃ mirror made by rPVD in fact exhibits no loss of reflectance between ~130 nm and 180 nm. Thus, the Al/AlF₃ mirror of FIG. 17 exhibits highly desirable properties of surface smoothness and FUV reflectance between 125 nm and 180 nm.

The embodiments of the present disclosure including the rPVD process embodiments of the present disclosure include benefits that were not possible with other coating processes that include protected-Al mirrors with unparallel FUV performance and stability. Embodiments of the present disclosure can be carried out at ambient temperature. The processes of the present disclosure are highly scalable processes, limited only by the sizes of the coating chamber where the passivation (with $XeF_2$) and evaporations of Al and LiF are carried out, therefore the implementation of this process for large area optics is highly feasible.

The techniques disclosed herein allow production of efficient Al mirrors reflecting light having short wavelengths in the FUV spectral region. Ground-based or space-based optical systems with sensitivity to the FUV would benefit from passivated mirrors of the present disclosure. Industries that may benefit from these techniques range from space telescopes with reflective elements to vacuum-ultraviolet (VUV) plasma analysis tools and wafer inspection tools.

This written description uses examples as part of the disclosure, including the best model, and also to enable any person skilled in the art to practice the disclosed implementations, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

While there have been shown, described and pointed out, fundamental features of the present disclosure as applied to the exemplary embodiments thereof, it will be understood that various omissions and substitutions and changes in the form and details of compositions, devices and methods illustrated, and in their operation, may be made by those skilled in the art without departing from the spirit or scope of the present disclosure. Moreover, it is expressly intended that all combinations of those elements and/or method steps, which perform substantially the same function in substantially the same way to achieve the same results, are within the scope of the present disclosure. Moreover, it should be recognized that structures and/or elements and/or method steps shown and/or described in connection with any disclosed form or embodiment of the present disclosure may be incorporated in any other disclosed or described or suggested form or embodiment as a general matter of design choice. It is the intention, therefore, to be limited only as indicated by the scope of the claims appended hereto.

What is claimed is:

1. A method of forming a passivated reflective laminate, comprising:

positioning a substrate in a first reaction chamber;

placing the first reaction chamber under vacuum with the substrate therein;

depositing an aluminum layer on the substrate while maintaining the vacuum;

exposing the aluminum layer to $XeF_2$ gas to form a layer of $AlF_3$ on the aluminum layer while maintaining the vacuum; and breaking the vacuum to obtain the passivated reflective laminate;

wherein:

the aluminum layer and the layer of $AlF_3$ are deposited at ambient temperature; and the layer of $AlF_3$ is a surface layer on the passivated reflective laminate.

2. The method of claim 1, further comprising:

outgassing the aluminum to form a getter coating on an inner wall of the first reaction chamber;

wherein outgassing the aluminum is performed prior to depositing the aluminum layer on the substrate.

3. The method of claim 1, wherein the substrate is a glass, a ceramic, a metal, or a semiconductor.

4. The method of claim 3, wherein the substrate is a glass.

5. The method of claim 3, wherein the substrate is a ceramic oxide, a ceramic nitride, or a ceramic carbide.

6. The method of claim 3, wherein the substrate is a semiconductor selected from the group consisting of silicon, germanium, gallium arsenide, gallium nitride, and silicon carbide.

7. The method of claim 1, wherein the $XeF_2$ gas is formed by sublimating $XeF_2$ solid.

8. The method of claim 7, wherein the $XeF_2$ gas is formed by sublimating $XeF_2$ solid under pressure.

9. The method of claim 7, wherein the $XeF_2$ gas is formed by sublimating $XeF_2$ solid under vacuum.

10. The method of claim 1, wherein the Al layer is exposed to the $XeF_2$ gas from about 3 to about 30 seconds after formation of the Al layer.

11. The method of claim 1, wherein depositing the aluminum layer is carried out by physical vapor deposition of aluminum at a rate of at least about 50 Å per second.

12. The method of claim 1, wherein exposing the aluminum layer to the $XeF_2$ gas forms the layer of $AlF_3$ at a rate of about 0.1 Å per second to about 1 Å per second.

13. The method of claim 1, further comprising:

positioning the passivated reflective laminate in a second reaction chamber;

placing the second reaction chamber under vacuum with the passivated reflective laminate therein;

depositing a dielectric layer on the passivated reflective laminate; and breaking the vacuum and removing the passivated reflective laminate from the second reactor chamber;

wherein the dielectric layer is a surface layer covering the layer of $AlF_3$.

14. The method of claim 13, wherein the first reaction chamber and the second reaction chamber are the same reaction chamber or different reaction chambers.

15. The method of claim 13, wherein the dielectric layer is a metal fluoride dielectric layer.

16. The method of claim 15, wherein the metal fluoride dielectric layer is a layer of LiF, $MgF_2$, or $CaF_2$.

17. The method of claim 13, wherein the dielectric layer is a ceramic dielectric layer.

18. The method of claim 13, wherein depositing the dielectric layer comprises:

depositing a first dielectric layer on the passivated reflective laminate while maintaining the vacuum; and depositing a second dielectric layer on the first dielectric layer while maintaining the vacuum;

wherein the first dielectric layer and the second dielectric layer have different refractive indexes.

19. The method of claim 13, wherein depositing the dielectric layer comprises:

depositing a first dielectric layer on a first region of the passivated reflective laminate; and depositing a second dielectric layer on a second region of the passivated reflective laminate;

wherein the first dielectric layer and the second dielectric layer have different refractive indexes.

* * * * *